(12) United States Patent
Egami et al.

(10) Patent No.: US 8,227,028 B2
(45) Date of Patent: Jul. 24, 2012

(54) METHOD FOR FORMING AMORPHOUS SILICA-BASED COATING FILM WITH LOW DIELECTRIC CONSTANT AND THUS OBTAINED AMORPHOUS SILICA-BASED COATING FILM

(75) Inventors: Miki Egami, Kitakyushu (JP); Akira Nakashima, Kitakyushu (JP); Michio Komatsu, Kawasaki (JP)

(73) Assignee: JGC Catalysts and Chemicals Ltd., Kawasaki-shi, Kanagawa (JP)

( * ) Notice: Subject to any disclaimer, the term of this patent is extended or adjusted under 35 U.S.C. 154(b) by 674 days.

(21) Appl. No.: 12/310,486

(22) PCT Filed: Jul. 11, 2007

(86) PCT No.: PCT/JP2007/063788
§ 371 (c)(1),
(2), (4) Date: Feb. 26, 2009

(87) PCT Pub. No.: WO2008/026387
PCT Pub. Date: Mar. 6, 2008

(65) Prior Publication Data
US 2010/0003181 A1   Jan. 7, 2010

(30) Foreign Application Priority Data

Aug. 28, 2006  (JP) ................. 2006-231202

(51) Int. Cl.
*B05D 3/02* (2006.01)
*B05D 3/04* (2006.01)
*H01L 29/00* (2006.01)

(52) U.S. Cl. ........ 427/240; 427/226; 427/377; 427/379; 427/387; 427/397.7; 423/335; 438/758; 438/781; 257/E21.271

(58) Field of Classification Search ............... 427/226, 427/240, 377, 379, 387, 397.7; 423/335; 438/758, 781; 257/E21.271
See application file for complete search history.

(56) References Cited

U.S. PATENT DOCUMENTS

| | | | |
|---|---|---|---|
| 7,998,567 B2 * | 8/2011 | Egami et al. | 428/304.4 |
| 2009/0025609 A1 * | 1/2009 | Egami et al. | 106/287.12 |

FOREIGN PATENT DOCUMENTS

| | | |
|---|---|---|
| JP | S62-056574 | 3/1987 |
| JP | S63-275124 | 11/1988 |
| JP | S64-033012 | 2/1989 |
| JP | H04-234119 | 8/1992 |
| JP | H11-256106 | 9/1999 |
| JP | 2004-079592 | 3/2004 |
| JP | 2004-149714 | 5/2004 |
| JP | 2004-153147 | 5/2004 |
| JP | 2005-116830 | 4/2005 |
| JP | 2006-117763 | 5/2006 |
| WO | WO 00/13221 | 3/2000 |
| WO | WO 2006/043439 A1 * | 4/2006 |
| WO | WO 2007/072750 | 6/2007 |
| WO | WO 2007/072750 A1 * | 6/2007 |

OTHER PUBLICATIONS

JPO computer translation of JP 2005-116830 A, published Apr. 2005.*
Exhibit A, Superheated steam, retrieved from [http://en.wikipedia.org/wiki/Superheated_steam] on Jan. 24, 2012.
Exhibit B, Superheated Steam: International site for Spirax Sarco, retrieved from [http://www.spiraxsarco.com/resources/steam-engineering-tutorials/steam-engineering-principles-and-heat-transfer/superheated-steam.asp] on Jan. 30, 2012.
Exhibit C, Superheated Steam, retrieved from [http://www.iklimnet.com/expert_hvac/steam_superheated.html] on Jan. 24, 2012.

* cited by examiner

*Primary Examiner* — Kirsten Jolley
(74) *Attorney, Agent, or Firm* — Leydig, Voit & Mayer, Ltd.

(57) ABSTRACT

A method of forming on a substrate an amorphous silica-based coating film having a low dielectric constant of 3.0 or below and a film strength (Young's modulus) of 3.0 GPa or more, which comprises, as a typical one, the steps of; (a) coating on the substrate a liquid composition containing hydrolysate of an organic silicon compound or compounds hydrolyzed in the presence of tetraalkylammonium hydroxide (TAAOH); (b) setting the substrate in a chamber and then drying a coating film formed on the substrate at a temperature in the range from 25 to 340° C.; (c) heating the coating film at a temperature in the range from 105 to 450° C. with introduction of a superheated steam having such a temperature into the chamber, and (d) curing the coating film at a temperature in the range from 350 to 450° C. with introduction of a nitrogen gas into the chamber.

16 Claims, 3 Drawing Sheets

METHOD FOR FORMING AMORPHOUS SILICA-BASED COATING FILM WITH LOW DIELECTRIC CONSTANT AND THUS OBTAINED AMORPHOUS SILICA-BASED COATING FILM

TECHNICAL FIELD

The present invention relates to a method for forming an amorphous silica-based coating film with a low dielectric constant of 3.0 or below and having a high film strength on a substrate, and also relates to an amorphous silica-based coating film with a low dielectric constant produced by the method.

BACKGROUND TECHNOLOGY

In association with the recent tendency for a higher degree of integration in semiconductor devices having multilayered wiring under 0.25 micron rule or below, as a space between the metal wiring layers becomes narrower, impedance between the metal wiring layers increases due to an electrostatic induction, and therefore there is a strong concern about delay in a response speed or increase in power consumption. To overcome this problem, it is necessary to make as low as possible a specific dielectric constant of an inter-layer insulating film provided between a semiconductor substrate and a metal wiring layer such as an aluminum wiring layer or between metal wiring layers.

The interlayer insulating film provided for the purpose as described above is generally formed on a semiconductor substrate by using a gas phase growth method such as the CVD method (i.e., Chemical Vapor Deposition Method) or a coating method such as the spin coating method.

In the silica-based coating film produced by using the latest techniques based on the CVD method, however, although it is possible to obtain a silica-based coating film with a specific dielectric constant of 3.0 or below, like in the coating films obtained by using the conventional coating method, there is still a defect that a film strength of the coating film becomes lower with decrease of the specific dielectric constant. In the CVD films made from polyaryl resin, fluorine-added polyimide resin, or fluorine resin, or those produced by using a coating film of any of the resins, although the dielectric constant is around 2, the adhesiveness to a surface of a substrate is rather low, and also the adhesiveness to a resist material used for fine mechanical processing is low. Furthermore there are the problems of, for instance, low chemical resistance or low resistance against oxygen plasma.

In the coating films obtained by using a coating liquid for forming a silica-based coating film, containing hydrolyte of alkoxysilane and/or halogenated silane, which has been widely used, although a silica-based coating film with a specific dielectric constant of 3.0 or below can be obtained, there are some problems relating to the low adhesiveness to a coated surface, the low film strength, the low chemical resistance, the low cracking resistance, the low resistance against oxygen plasma, and the like.

The present inventors made strenuous and concentrated efforts for solving the problems described above, and found that, by using a liquid composition containing a silicon compound obtained by hydrolyzing tetraalkyl orthosilicate (TAOS) and particular alkoxysilane (AS) in the presence of tetraalkyl ammonium hydroxide (TAAOH), it is possible to form an amorphous silica-based coating film with a low dielectric constant and having a high film strength, and also excellent in such properties as adhesiveness to a coated surface, flatness of a coated surface, moisture resistance (i.e., hydrophobicity), chemical resistance, cracking resistance, resistance against oxygen plasma, and workability by etching, and they filed patent applications based on the finding (Refer to patent document 1 and patent document 2). Furthermore, the present inventors found that, by coating the liquid composition on a substrate, heating the coated film under a temperature in the range from 80 to 350° C., and then curing the dried film at a temperature in the range from 350 to 450° C., it is possible to form an amorphous silica-based coating film with a low dielectric constant and having a lot of micropores therein, and they filed a patent application based on the finding (Refer to patent document 3).

Furthermore, the present inventors found that, by using a liquid composition containing a silicon compound obtained by hydrolyzing bis(trialkoxysillyl)alkane (BTASA) and alkoxysilane (AS) in the presence of tetraalkyl ammonium hydroxide (TAAOH), or a liquid composition containing a silicon compound obtained by hydrolyzing bis(trialkoxysillyl)alkane (BTASA), alkoxysilane (AS), and tetraalkyl orthosilicate (TAOS) in the presence of tetraalkyl ammonium hydroxide (TAAOH), it is possible to form an amorphous silica-based coating film with a low dielectric constant of 2.5 or below and having a high film strength, and also excellent in such properties as adhesiveness to a coated surface, flatness of a coated surface, moisture resistance (i.e., hydrophobicity), chemical resistance, cracking resistance, resistance against oxygen plasma, and workability by etching, and they filed a patent application on the finding (Refer to patent document 4).

Patent document 4 also discloses a method of forming an amorphous silica-based coating film with a low dielectric constant by coating the liquid composition on a substrate, heating the coated film at a temperature in the range from 80 to 350° C., and then curing the dried film at a temperature in the range from 350 to 450° C.

Patent document 5 discloses a method of forming a silica-based coating film by coating on a substrate a coating liquid containing polysilane obtained by reacting an organic compound having ROH group with a halogen-containing polysilane which is a product of a reaction between a monoorgano trihalosilane compound and a diorgano dihalosilane, drying the coated film at a temperature in the range from 50 to 250° C., and then curing the dried film at a temperature in the range from 300 to 500° C. in the presence of steam or oxygen. Although the silica-based coating film obtained by this method shows a specific dielectric constant of 3.0 or below, there is the problem that the silica-based coating film does not satisfy the requirements for physical properties such as a film strength or the like.

Furthermore, patent document 6 discloses a method of producing a porous silica by curing a porous silica precursor obtained from a solution containing a partially hydrolyzed condensate of an alkoxysilane and a surface active surfactant at a temperature in the range from 260 to 450° C. in an atmosphere containing $H_2O$ to remove organic compounds contained in the precursor. However, the porous silica film obtained by the method has mesopores therein and shows a low specific dielectric constant, but the film strength (as the modulus of elasticity) is disadvantageously low.

Patent document 1: JP 2004-149714 A
Patent document 2: JP 2006-117763 A
Patent document 3: JP 2004-153147 A
Patent document 4: Japanese Patent Application No. 2005-371017
Patent document 5: JP H11-256106 A
Patent document 6: JP 2005-116830 A

DISCLOSURE OF THE INVENTION

Problems to be Solved by the Invention

The present inventors made strenuous and concentrated efforts for developing a method of stably forming an amorphous silica-based coating film having a high film strength and a low dielectric constant of 3.0 or below, preferably of 2.5 or below without giving any damage to copper wiring or aluminum wiring provided on a substrate by using the liquid composition described in Patent documents 1, 2, 4 or in other documents, and founds that the desired coating film will be obtainable from a method by coating the liquid composition on a substrate, drying the coated film at a particular temperature, heating the dried film with introduction of a superheated steam, and then curing the heated film with introduction of a nitrogen gas according to the necessity. The present invention was made based on the finding described above. Namely, an objective of the present invention is to provide a method of stably forming on a substrate an amorphous silica-based coating film having the physical properties such as a low dielectric constant of 3.0 or below, preferably of 2.5 or below, and a film strength, as expressed by Young's modulus, of 3.0 GPa (Giga Pascal) or more, preferably of 5.0 GPa or more.

In this invention, the coated film, the dried film and the heated film as described above and also the cured film are hereinafter referred to as "the coating film" simply.

Means for Solving the Problem

The first method for forming an amorphous silica-based coating film according to the present invention (sometimes hereinafter referred to as "the first method" simply) provides a method of forming on a substrate an amorphous silica-based coating film with a low dielectric constant of 3.0 or below and also having a high film strength, which comprises the steps of:

(1) coating on the substrate a liquid composition containing hydrolysate of an organic silicon compound or compounds hydrolyzed in the presence of tetraalkylammonium hydroxide (TAAOH) (i.e., coating step);

(2) setting the substrate in a chamber, and then drying a coating film formed on the substrate at a temperature in the range from 25 to 340° C. (i.e., drying step);

(3) heating the coating film at a temperature in the range from 105 to 450° C. with introduction of a superheated steam having such a temperature into the chamber (i.e., heating step); and (4) curing the coating film at a temperature in the range from 350 to 450° C. with introduction of a nitrogen gas into the chamber (i.e., curing step).

The second method for forming an amorphous silica-based coating film according to the present invention (sometimes hereinafter referred to as "the second method" simply) provides a method of forming on a substrate an amorphous silica-based coating film with a low dielectric constant of 3.0 or below and also having a high film strength, which comprises the steps of:

(1) coating on the substrate a liquid composition containing hydrolysate of an organic silicon compound or compounds hydrolyzed in the presence of tetraalkylammonium hydroxide (TAAOH) (i.e., coating step);

(2) setting the substrate in a chamber, and then drying a coating film formed on the substrate at a temperature in the range from 25 to 340° C. (i.e., drying step); and (3) heating the coating film at a temperature in the range from 105 to 450° C. with introduction of a superheated steam having such a temperature into the chamber (i.e., heating step).

The third method for forming an amorphous silica-based coating film according to the present invention (sometimes hereinafter referred to as "the third method" simply) provides a method of forming on a substrate an amorphous silica-based coating film with a low dielectric constant of 3.0 or below and also having a high film strength, which comprises the steps of:

(1) coating on the substrate a liquid composition containing hydrolysate of an organic silicon compound or compounds hydrolyzed in the presence of tetraalkylammonium hydroxide (TAAOH) (i.e., coating step); and (2) setting the substrate in a chamber, and then heating a coating film formed on the substrate at a temperature or temperatures in the range from 105 to 450° C. with introduction of a superheated steam having such a temperature into the chamber (i.e., heating step).

The liquid composition used in the coating step as described above preferably contains hydrolysate of organic silicon compounds obtained by hydrolyzing, in the presence of tetraalkylammonium hydroxide (TAAOH), tetraalkyl orthosilicate (TAOS) and alkoxysilane (AS) expressed by the following general formula (I):

(wherein X denotes a hydrogen atom, a fluorine atom, an alkyl group having 1 to 8 carbon atoms, a fluoride-substituted alkyl group, an aryl group, or a vinyl group; and R denotes a hydrogen atom, an alkyl group having 1 to 8 carbon atoms, an aryl group, or a vinyl group; and n is an integer of 1 to 3).

The liquid composition used in the coating step as described above preferably contains hydrolysate of organic silicon compounds obtained by hydrolyzing, in the presence of tetraalkylammonium hydroxide (TAAOH), bis(trialkoxysilyl)alkane (BTASA) expressed by the following general formula (II) and alkoxysilane (AS) expressed by the following general formula (I):

(wherein X denotes a hydrogen atom, a fluorine atom, an alkyl group having 1 to 8 carbon atoms, a fluoride-substituted alkyl group, an aryl group, or a vinyl group; and R denotes a hydrogen atom, an alkyl group having 1 to 8 carbon atoms, an aryl group, or a vinyl group; and n is an integer of 1 to 3), and

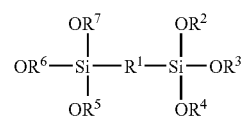

(wherein $R^1$ denotes a methylene group, an ethylene group, or a propylene group; and $R^2$ to $R^7$, which may be identical to or different from each other, denotes a hydrogen atom, an alkyl group having 1 to 8 carbon atoms, a fluoride-substituted alkyl group, an aryl group, or a vinyl group.)

The liquid composition used in the coating step as described above preferably contains hydrolysate of organic silicon compounds obtained by hydrolyzing, in the presence of tetraalkylammonium hydroxide (TAAOH), bis(trialkoxysilyl)alkane (BTASA) expressed by the following general formula (II), alkoxysilane (AS) expressed by the following general formula (I), and tetraalkyl orthosilicate (TAOS):

(wherein X denotes a hydrogen atom, a fluorine atom, an alkyl group having 1 to 8 carbon atoms, a fluoride-substituted alkyl group, an aryl group, or a vinyl group; and R denotes a hydrogen atom, an alkyl group having 1 to 8 carbon atoms, an aryl group, or a vinyl group; and n is an integer of 1 to 3), and

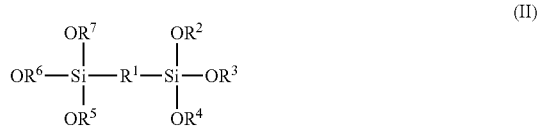

(wherein $R^1$ denotes a methylene group, an ethylene group, or a propylene group, and $R^2$ to $R^7$, which may be identical to or different from each other, denotes a hydrogen atom, an alkyl group, a fluorine-substituted alkyl group having 1 to 8 carbon atoms, an aryl group or a vinyl group.)

The operation in the coating step as described above is preferably carried out with use of a spin coating method.

The operation in the drying step of the first and second methods as described above is preferably carried out for 0.5 to 10 minutes at a temperature in the range from 25 to 340° C. with introduction of a nitrogen gas or air into the chamber. More preferably, the drying temperature is in the range from 100 to 250° C.

Furthermore, the operation in the heating step of the first, second, and third methods as described above is preferably carried out for 1 to 70 minutes at a temperature in the range from 105 to 450° C. with introduction of a superheated steam having such a temperature into the chamber. More preferably, the heating temperature is in the range from 250 to 350° C.

The operation in the heating step of the third method as described above is preferably carried out for 1 to 20 minutes at a temperature in the range from 105 to 130° C. with introduction of a superheated steam having such a temperature into the chamber and then for 1 to 70 minutes at a temperature in the range from 130 to 450° C. with introduction of a superheated steam having such a temperature into the chamber.

Furthermore, the operation in the curing step of the first method as described above is preferably carried out for 5 to 90 minutes at a temperature in the range from 350 to 450° C. with introduction of a nitrogen gas into the chamber.

The operations up to the heating step or the curing step as described above are preferably carried out in such conditions that the coating film obtained from the heating step or the curing step has a volume with a shrinkage of 5 to 40% as against the volume of the coating film formed in the coating step.

On the other hand, the amorphous silica-based coating film with a low dielectric constant according to the present invention, which is obtained by the method as described above, has a specific dielectric constant of 3.0 or below and a film strength, as expressed by Young's modulus, of 3.0 GPa or more.

Preferable applications of the coating film include an interlayer insulating film formed on a semiconductor substrate.

Effects of the Inventions

By employing the first method of forming a coating film according to the present invention, namely by using the method in which a substrate with a coating film formed thereon by coating the liquid composition as described below is dried at a particular temperature, and the coating film is heated with introduction of a superheated steam and cured with introduction of a nitrogen gas, it is possible to stably form an amorphous silica-based coating film with a low dielectric constant of 3.0 or below, preferably of 2.5 or below and having the film strength, as expressed by the Young's modulus, of 3.0 GPa or more, preferably of 5.0 GPa or more, although these parameters vary dependent upon the liquid composition to be used. Furthermore, when a liquid composition containing hydrolysate of organic silicon compounds obtained by hydrolyzing tetraalkyl orthosilicate (TAOS) and alkoxysilane (AS) in the presence of the tetraalkylammonium hydroxide (TAAOH) is used as the liquid composition, it is possible to stably and easily form an amorphous silica-based coating film with a low dielectric constant as described above and also having the Young's modulus of 8.0 GPa or more on a substrate.

It can be presumed that the effect as described above can be obtained by; (1) when an organic solvent or water contained in the coating film is vaporized in the drying step, some shrinkage of the coating film and hardening of its surface start, and (2) when the tetraalkylammonium hydroxide (TAAOH) contained in the coating film is decomposed and vaporized in the heating step, further shrinkage of the coating film (with decrease of its thickness) proceeds with formation of micropores therein (which are formed at the places that the decomposed materials of TAAOH were fallen out from the film) and also with formation of the —O—Si—O—Si— network (with a three-dimensionally bridging structure) which can be obtained with polymerization of the silicon compounds contained in coating film, by which excellent physical properties such as a low specific dielectric constant and a high film strength are given to the amorphous silica-based coating film. Furthermore, it can be presumed that, when the coating film is subjected to the curing step in addition to the above steps, construction of the network further proceeds and a silica-based coating film having a higher film strength can be obtained. The mechanism of which the silica-based coating film having the physical properties as described above is formed has not sufficiently been clarified yet, but the effect was achieved by carrying out the operation in the drying step at a particular temperature and then carrying out the operation in the heating step with introduction of a superheated steam. Moreover, it can be presumed that the effect provided by the radiation heat of the superheated steam is quite large in the heating step.

Furthermore, even with the second method for forming a coating film according to the present invention, namely the method in which the curing step employed in the first method as described above is excluded, or even with the third method for forming a coating film according to the present invention, namely the method in which the drying step and the curing step employed in the first method are excluded, it is possible to more easily form an amorphous silica-based film with excellent physical properties such as a low dielectric constant of 3.0 or below and a high film strength, as expressed by the Young's modulus, of 3.0 GPa or more, as compared to any known method, namely the method in which a coating film formed by coating the liquid composition on a substrate is dried at a temperature in the range from 80 to 350° C. and is further cured at a temperature in the range from 350 to 450° C., although the result varies dependent upon the liquid composition to be used.

Furthermore, the amorphous silica-based film with a low dielectric constant obtained by the present invention has, in addition to the physical properties as described above, the excellent characteristics such as the high adhesiveness to a surface of a semiconductor substrate or the like on which a coating film is formed, the flatness of a surface of the coating film, the high moisture resistance (i.e., hydrophobicity), the high chemical resistance such as the alkali resistance and the cracking resistance, and also has the process adaptability such as resistance against oxygen plasma and workability by etching.

Because of the excellent features as described above, the present invention enables high yield production of semiconductor substrates or other products having the amorphous silica-based film with a low dielectric constant formed thereon which are strongly desired in the recent semiconductor industry.

BEST MODE FOR CARRYING OUT THE PRESENT INVENTION

A method of forming an amorphous silica-based coating film with a low dielectric constant according to the present invention and an amorphous silica-based coating film produced by the method are described in detail below.

[Method of Forming an Amorphous Silica-Based Coating Film with a Low Dielectric Constant]

(A) Preparation of Liquid Composition

The liquid composition used in the present invention includes coating liquids for forming an amorphous silica-based film with a low dielectric constant as described in Patent documents 1, 2 and 4, the details of which are described below. However, It should be noted that the liquid composition to be used in the present invention are not limited to those described in the patent documents above.

Coating Liquid A

As the liquid composition which can be used in the present invention, there is a coating liquid containing hydrolysate of organic silicon compounds obtained by hydrolyzing, in the presence of tetraalkylammonium hydroxide (TAAOH), tetraalkyl orthosilicate (TAOS) and alkoxysilane (AS) expressed by the following general formula (I) (hereinafter referred to as "coating liquid A").

The coating liquid A is further classified into two types of the coating liquids A-1 and A-2 as follows.

(1) Coating liquid A-1 which is a liquid composition containing hydrolysate of organic silicon compounds obtained by hydrolyzing the tetraalkyl orthosilicate (TAOS) and the alkoxysilane (AS) expressed by the general formula (I) in the presence of tetraalkylammonium hydroxide (TAAOH).

$$X_nSi(OR)_{4-n} \quad (I)$$

(wherein X denotes a hydrogen atom, a fluorine atom, an alkyl group having 1 to 8 carbon atoms, a fluoride-substituted alkyl group, an aryl group, or a vinyl group; and R denotes a hydrogen atom, an alkyl group having 1 to 8 carbon atoms, an aryl group, or a vinyl group; and n is an integer of 1 to 3).

(2) Coating liquid A-2 which is a liquid composition containing hydrolysate of organic silicon compounds obtained by (i) hydrolyzing or partially hydrolyzing the tetraalkyl orthosilicate (TAOS) in the presence of the tetraalkyl ammonium hydroxide (TAAOH), (ii) mixing thus obtained product with the alkoxysilane (AS) expressed by the following general formula (I) and/or its hydrolysate or its partial hydrolysate, and (iii) further hydrolyzing whole or a portion of the mixed silicon compounds.

$$X_nSi(OR)_{4-n} \quad (I)$$

(wherein X denotes a hydrogen atom, a fluorine atom, an alkyl group having 1 to 8 carbon atoms, a fluoride-substituted alkyl group, an aryl group, or a vinyl group; and R denotes a hydrogen atom, an alkyl group having 1 to 8 carbon atoms, an aryl group, or a vinyl group; and n is an integer of 1 to 3).

The tetraalkyl orthosilicate (TAOS) includes, but not limited to, tetramethyl orthosilicate, tetraethyl orthosilicate, tetrapropyl orthosilicate, tetraisopropyl orthosilicate, and tetrabutyl orthosilicate. Of these materials, it is preferable to use tetraethyl orthosilicate (TEOS), tetramethyl orthosilicate (TMOS), or a mixture thereof.

The alkoxysilane (AS) includes, but not limited to, methyl trimethoxysilane, methyl triethoxysilane, methyl triisopropoxysilane, ethyl trimethoxysilane, ethyl triethoxysilane, ethyl triisopropoxysilane, octyl trimethoxysilane, octyl triethoxysilane, vinyl trimethoxysilane, vinyl triethoxysilane, phenyl trimethoxysilane, phenyl triethoxysilane, trimethoxysilane, triethoxysilane, triisopropoxysilane, fluorotrimethoxysilane, fluorotriethoxysilane, dimethyl dimethoxysilane, dimethyl diethoxysilane, diethyl dimethoxysilane, diethyl diethoxysilane, dimethoxysilane, diethoxysilane, difluorodimethoxysilane, difluorodiethoxysilane, trifluoromethyl trimethoxysilane, and trifluoromethyl triethoxysilane. Of these materials, it is preferable to use methyl trimethoxysilane (MTMS), methyl triethoxysilane (MTES), or a mixture thereof.

The tetraalkylammonium hydroxide (TAAOH) includes, but not limited to, tetramethylammonium hydroxide, tetraethyl ammonium hydroxide, tetrapropyl ammonium hydroxide, tetrabutyl ammonium hydroxide, tetra-n-octyl ammonium hydroxide, n-hexadecyltrimethyl ammonium hydroxide, and n-octadecyltrimethyl ammonium hydroxide. Of these materials, it is preferable to use tetrapropyl ammonium hydroxide (TPAOH), tetrabutyl ammonium hydroxide (TBAOH), or a mixture thereof.

When the tetraalkylammonium hydroxide (TAAOH) on the market which often contains some impurities is used in the present invention, it is necessary to substantially remove the impurities comprising compounds of alkali metal elements such as sodium (Na) and potassium (K), and compounds of halogen elements such as bromine (Br) and chloride (Cl) by subjecting the tetraalkylammonium hydroxide (TAAOH) to an ion exchange treatment using a cation exchange resin and also to an ion exchange treatment using an anion exchange resin. Namely, it is desirable to reduce each content of the compounds of alkali metal elements such as sodium (Na) and potassium (K) to 50 ppb by weight or below as the element base respectively and each content of the compounds of halogen elements such as bromine (Br) and chlorine (Cl) to 1 ppm by weight or below as the element base respectively.

In the liquid composition which corresponds to the coating liquid A-1, a molar ratio (TAOS/AS) between the tetraalkyl orthosilicate (TAOS) and the alkoxysilane (AS) is preferably in the range from 6/4 to 2/8, and more preferably in the range from 5/5 to 3/7 in terms of $SiO_2$.

Furthermore, a molar ratio (TAAOH/(TAOS+AS)) between the tetraalkylammonium hydroxide (TAAOH) and the components for forming the silica-based coating film (i.e., TAOS and AS) is preferably in the range from 1/10 to 7/10, more preferably in the range from 1/10 to 6/10 in terms of $SiO_2$.

In the liquid composition which corresponds to the coating liquid A-2, like in the case of the coating liquid A-1, it is preferable to add tetraalkylammonium hydroxide (TAAOH) so that a molar ratio (TAAOH/TAOS and TAAOH/AS) between the tetraalkylammonium hydroxide (TAAOH) and each of the components for forming the silica-based coating film, namely the tetraalkyl orthosilicate (TAOS) and alkoxysilane (AS) is in the range from 1/10 to 7/10, more preferably in the range from 1/10 to 6/10 in terms of $SiO_2$ respectively. Therefore, the molar ratio (TAAOH/(TAOS+AS)) between the tetraalkylammonium hydroxide (TAAOH) and the components for forming the silica-based coating film (i.e., TAOS and AS) after mixing the materials together is, like in the case of the coating liquid A-1, in the range from 1/10 to 7/10, preferably in the range from 1/10 to 6/10 in terms of $SiO_2$.

When the materials are mixed, like in the case of the coating film A-1, it is preferable to mix the materials so that the molar ratio (TAOS/AS) between the tetraalkyl orthosilicate (TAOS) and the alkoxysilane (AS) is in the range from 6/4 to 2/8, preferably in the range from 5/5 to 3/7 in terms of $SiO_2$.

As a method of preparing the liquid compositions (i.e., coating liquid A-1 and coating liquid A-2), it is possible to employ the methods described in patent document 1 or patent document 2. A representative example of the method for preparing the coating liquid A-1 is described below.

(i) After tetraalkyl orthosilicate (TAOS) and alkoxysilane (AS) expressed by the general formula (I) above are mixed with an organic solvent, the materials are agitated at the rotating seed of 100 to 200 rpm at a temperature in the range from 10 to 30° C. until the materials are fully mixed with each other.

(ii) Then, an aqueous solution of tetraalkylammonium hydroxide (TAAOH) is dripped into the mixture solution being agitated over 5 to 20 minutes, and the resultant mixture solution is further agitated for 30 to 90 minutes at a temperature in the range from 10 to 30° C. at the rotating speed of 100 to 200 rpm.

(iii) Then, the mixture solution is heated to a temperature in the range from 30 to 80° C., and is agitated at the temperature for 1 to 72 hours at the rotating speed of 100 to 200 rpm to prepare a liquid composition containing hydrolysate of organic silicon compounds obtained by hydrolyzing the tetraalkyl orthosilicate (TAOS) and the alkoxysilane (AS).

In this preparing method, the tetraalkyl orthosilicate (TAOS), the alkoxysilane (AS), and the tetraalkylammonium hydroxide (TAAOH) are mixed or added respectively to satisfy the molar ratios as described above.

The organic solvent as described above includes, but not limited to, alcohols, ketones, ethers, esters, and hydrocarbons, and more specifically, alcohols such as methanol, ethanol, propanol, and butanol; ketones such as methyl ethyl ketone, and methyl isobutyl ketone; glycol ethers such as methyl cellosolve, ethyl cellosolve, propylene glycol monopropylether; glycols such as ethylene glycol, propylene glycol, hexylene glycol; esters such as methyl acetate, ethyl acetate, methyl lactate, and ethyl lactate; hydrocarbons such as hexane, cyclohexane, and octane; and aromatic hydrocarbons such as toluene, xylene, and mesitylene. Of these materials, it is preferable to use alcohols such as ethanol.

There is no specific restriction over a quantity of the organic solvent to be used, but the mixing weight ratio (Organic solvent/(TAOS+AS)) between the organic solvent and the components for forming the silica-based coating film (i.e., TAOS and AS) is preferably in the range from 1/1 to 3/1, and more preferably in the range from 1/1 to 2.5/1.

An aqueous solution of the tetraalkylammonium hydroxide (TAAOH) to be dripped into the mixture solution preferably contains the tetraalkylammonium hydroxide (TAAOH) by 5 to 40% by weight, more preferably by 10 to 30% by weight in distilled water or ultrapure water. However, because the water contained in this aqueous solution is used for effecting a hydrolysis reaction of the tetraalkyl orthosilicate (TAOS) and the alkoxysilane (AS), the quantity of water must be enough for effecting the hydrolysis reaction. As for a catalyst for promoting the hydrolysis reaction, because the tetraalkylammonium hydroxide (TAAOH) has the catalytic function, it is not necessary to add any specific catalyst (such as, for instance, ammonia) from the outside.

The hydrolysis reaction is preferably carried out for 1 to 72 hours, more preferably for 10 to 48 hours under agitation at a temperature in the range from 30 to 80° C., more preferably in the range from 35 to 60° C.

A number average molecular weight of the hydrolysate of organic silicon compounds (i.e., TAOS and AS) contained in the liquid composition obtained as described above is preferably in the range from 500 to 1000000, and more preferably in the range from 1000 to 100000 in terms of polyethylene oxide. When the number average molecular weight is within the range as described above, it is possible to prepare a liquid composition for forming a silica-based coating film, having excellent properties in a long-term stability and adaptability to coating.

In the present invention, the liquid composition containing the hydrolysate of organic silicon compounds obtained as described above may be used for forming the coating film as it is, but the liquid composition may be subjected to the solvent substitution process to replace the organic components contained in the liquid composition with an organic solvent selected from propylene glycol monopropyl ether (PGP), propylene glycol monomethyl ether (PGME), propylene glycol monoethyl ether acetate (PGMEA) or the like by using a rotary evaporator or other equipment.

A quantity of the hydrolysate of organic silicon compounds contained in the liquid composition as described above is preferably adjusted so that a content of the components in the liquid composition is in the range from 2 to 20% by weight, preferably in the range from 3 to 15% by weight in term of $SiO_2$, although the quantity varies dependent upon a purpose of use thereof.

There is no specific restriction over a quantity of water contained in the liquid composition, but the water content is preferably 60% by weight or below to the total quantity of the liquid composition, and more preferably in the range from 0.1 to 50% by weight.

The organic solvent is a remnant component (balancing component) constituting the liquid composition, and there is no specific restriction over the content, but the content of the organic solvent in the liquid composition is preferably in the range from 20 to 68% by weight. In this preparing method, the content of the organic solvent as used herein means a total content of the organic solvent (such as propylene glycol monopropylether) used in the solvent substitution process and the organic solvent (such as ethanol) having been not replaced with the above organic solvent and remaining in the liquid composition.

When the contents of water and organic solvent are in the ranges as described above respectively, it is possible to obtain a liquid composition (i.e., coating liquid A) for forming an amorphous silica-based coating film with the low dielectric constant of 3.0 or below and having the high film strength.

Coating Liquid B

As the liquid composition which can be used in the present invention, there is a coating liquid containing hydrolysate of organic silicon compounds obtained by hydrolyzing, in the presence of tetraalkylammonium hydroxide (TAAOH), bis(trialkoxysilyl)alkane (BTASA) expressed by the following general formula (II) and alkoxysilane (AS) expressed by the following general formula (I) (hereinafter referred to as "coating liquid B"):

$$X_nSi(OR)_{4-n} \quad (I)$$

(wherein X denotes a hydrogen atom, a fluorine atom, an alkyl group having 1 to 8 carbon atoms, a fluoride-substituted alkyl group, an aryl group, or a vinyl group; and R denotes a hydrogen atom, an alkyl group having 1 to 8 carbon atoms, an aryl group, or a vinyl group; and n is an integer of 1 to 3), and

(II)

(wherein $R^1$ denotes a methylene group, an ethylene group, or a propylene group, and $R^2$ to $R^7$, which may be identical to or different from each other, denotes a hydrogen atom, an alkyl group having 1 to 8 carbon atoms, a fluorine-substituted alkyl group, an aryl group, or a vinyl group.)

More specifically, the liquid composition contains hydrolysate of organic silicon compounds obtained by hydrolyzing the bis(trialkoxysillyl)alkane (BTASA) and the alkoxysilane (AS) at a temperature from 40 to 80° C. in the presence of tetraalkylammonium hydroxide (TAAOH).

The bis(trialkoxysillyl)alkane (BTASA) described above includes, but not limited to, bis(trimethoxysillyl)methane, bis(triethoxysillyl)methane, bis(tripropoxysillyl)methane, bis(trimethoxysillyl)ethane, bis(triethoxysillyl)ethane, bis(tripropoxysillyl)ethane, bis(trimethoxysillyl)propane, bis(triethoxysillyl)propane, and bis(tripropoxysillyl) propane. Of these materials, as the bis(trialkoxysillyl)alkane (BTASA), it is preferable to use bis(trimethoxysillyl)methane (BTMSM), bis(triethoxysillyl)methane (BTESM), bis(trimethoxysillyl)ethane (BTMSE), bis(triethoxysillyl)ethane (BTEME), or a mixture thereof.

The alkoxysilane (AS) and the tetraalkylammonium hydroxide (TAAOH) to be used for preparing the coating liquid B may be the same as those used for preparing the coating liquid A. As for the tetraalkylammonium hydroxide (TAAOH) to be used for preparing the coating liquid B, like in the case of preparing the coating liquid A, it is preferable to subject the tetraalkylammonium hydroxide on the market (which often contains some impurities) to the ion exchange treatments using a cation exchange resin and also an anion exchange resin for removing the impurities contained therein. By the ion exchange treatments, each content of the compounds of alkali metal elements such as sodium (Na) and potassium (K) is reduced to 50 ppb by weight or below as the element base respectively, and also each content of the compounds of halogen elements such as bromine (Br) and chlorine (Cr) is reduced to 1 ppm by weight or below as the element base respectively.

In the liquid composition which corresponds to the coating liquid B, a molar ratio (BTASA/AS) between the bis(trialkoxysillyl)alkane (BTASA) and the alkoxysilane (AS) is preferably in the range from 7/3 to 3/7, and more preferably in the range from 6/4 to 4/6 in terms of $SiO_2$.

Furthermore, a molar ratio (TAAOH/(BTASA+AS)) between the tetraalkylammonium hydroxide (TAAOH) and a total quantity of the bis(trialkoxysillyl) alkane (BTASA) and the alkoxysilane (AS) is preferably in the range from 1/10 to 6/10, and more preferably in the range from 2/10 to 4/10 in terms of $SiO_2$.

For preparing the liquid composition (i.e., coating liquid B), the method described in Patent document 4 may be employed. A representative example of the method for preparing the coating liquid B is described below.

(i) The bis(trialkoxysillyl)alkane (BTASA) and the alkoxysilane (AS) are mixed with an organic solvent, and the resultant mixture solution is agitated at a temperature in the range from 10 to 30° C. and at a rotating speed in the range from 100 to 200 rpm until the components are fully mixed with each other.

(ii) Then, an aqueous solution of the tetraalkylammonium hydroxide (TAAOH) is dripped into the mixture solution above being agitated over 5 to 20 minutes, and the resultant mixture solution is agitated for 30 to 90 minutes at a temperature in the range from 10 to 30° C. and at a rotating speed in the range from 100 to 200 rpm.

(iii) Then, the resultant mixture solution is heated to a temperature in the range from 40 to 80° C., and is agitated for 1 to 72 hours at the temperature and at a rotating speed in the range from 100 to 200 rpm to prepare a liquid composition containing hydrolysate of organic silicon compounds obtained by hydrolyzing the bis(trialkoxysillyl) alkane (BTASA) and the alkoxysilane (AS).

In this preparing method, the bis(trialkoxysillyl)alkane (BTASA), the alkoxysilane (AS), and the tetraalkylammonium hydroxide (TAAOH) are mixed or added at the molar ratios described above respectively.

The same organic solvent as that used for preparation of the coating liquid A may be used also in this preparing method.

There is no specific restriction over a quantity of the organic solvent to be used in this preparing method, but the mixing weight ratio (Organic solvent/(BTASA+AS)) between the organic solvent and the components for forming the silica-based coating film (i.e., BTASA and AS) is preferably in the range from 1/1 to 3/1, and more preferably in the range from 1/1 to 2.5/1.

The aqueous solution of the tetraalkylammonium hydroxide (TAAOH) to be dripped in the mixture solution preferably contains the tetraalkylammonium hydroxide (TAAOH) by 5 to 40% by weight, more preferably by 10 to 30% by weight in distilled water or ultra pure water. However, the water contained in this aqueous solution is used for effecting hydrolysis of the bis(trialkoxysillyl)alkane (BTASA) and the alkoxysilane (AS), and therefore the quantity of water must be sufficient for effecting the hydrolysis reaction.

The tetraalkylammonium hydroxide (TAAOH) has the catalytic function for promoting the hydrolysis reaction, and therefore it is not necessary to add any specific catalyst (such as ammonia) for effecting the reaction.

The hydrolysis reaction is preferably performed under agitation for 1 to 72 hours, more preferably for 10 to 48 hours at a temperature in the range from 40 to 80° C., more preferably in the range from 50 to 80° C.

A number average molecular weight of the hydrolysate of organic silicon compounds (i.e., BTASA and AS) is preferably in the range from 3,000 to 70,000, more preferably in the range from 5,000 to 50,000 in terms of polyethylene oxide. When the number average molecular weight is within the range described above, it is possible to prepare a liquid composition for forming a silica-based coating film, having excellent properties in a long-term stability and adaptability to coating.

The liquid composition obtained by the method described above may be used for forming the coating film as it is, but like in the case of preparing the coating liquid A, the liquid composition is preferably subjected to the solvent substitution process to replace the organic solvent components contained in the liquid composition with an organic solvent selected from propylene glycol monopropylene ether (PGP), propylene glycol monomethylether (PGME), propylene glycol monoethylether acetate (PGMEA), or the like by using a rotary evaporator or other equipment.

A quantity of the hydrolysate of organic silicon compounds contained in the liquid composition as described above is preferably adjusted so that a content of the components in the liquid composition is in the range from 1 to 20% by weight, preferably in the range from 1 to 10% by weight in terms of $SiO_2$, although the quantity varies dependent upon a purpose of use thereof.

There is no specific restriction over a quantity of water contained in the liquid composition, but the water content is preferably 60% by weight or below to the total quantity of the liquid composition, and more preferably in the range from 0.1 to 50% by weight.

The organic solvent is a remnant component (balancing component) constituting the liquid composition, and there is no specific restriction over the content, but the content of the organic solvent in the liquid composition is preferably in the range from 20 to 99% by weight. In this preparing method, the content of the organic solvent as used herein means a total content of the organic solvent (such as propylene glycol monopropylether) used in the solvent substitution process and the organic solvent (such as ethanol) having been not replaced with the above organic solvent and remaining in the liquid composition.

When the contents of water and organic solvent are in the ranges as described above respectively, it is possible to obtain a liquid composition (i.e., coating liquid B) for forming an amorphous silica-based coating film with the low dielectric constant of 3.0 or below and having the high film strength.

Coating Liquid C

As the liquid composition which can be used in the present invention, there is a coating liquid containing hydrolysate of organic silicon compounds obtained by hydrolyzing, in the presence of tetraalkylammonium hydroxide (TAAOH), bis (trialkoxysilyl)alkane (BTASA) expressed by the following general formula (II), alkoxysilane (AS) expressed by the following general formula (I), and tetraalkyl orthosilicate (TAOS) (hereinafter referred to as "coating liquid C"):

$$X_nSi(OR)_{4-n} \quad (I)$$

(wherein X denotes a hydrogen atom, a fluorine atom, an alkyl group having 1 to 8 carbon atoms, a fluoride-substituted alkyl group, an aryl group, or a vinyl group; and R denotes a hydrogen atom, an alkyl group having 1 to 8 carbon atoms, an aryl group, or a vinyl group; and n is an integer of 1 to 3), and

(II)

(wherein $R^1$ denotes a methylene group, an ethylene group, or a propylene group, and $R^2$ to $R^7$, which may be identical to or different from each other, denotes a hydrogen atom, an alkyl group, a fluorine-substituted alkyl group having 1 to 8 carbon atoms, an aryl group or a vinyl group.)

More specifically, the liquid composition contains hydrolysate of organic silicon compounds obtained by hydrolyzing the bis(trialkoxysillyl)alkane (BTASA), the alkoxysilane (AS), and the tetraalkyl orthosilicate (TEOS) at a temperature in the range from 40 to 80° C. in the presence of the tetraalkylammonium hydroxide (TAAOH).

The bis(trialkoxysillyl)alkane (BTASA), the alkoxysilane (AS), the tetraalkyl orthosilicate (TEOS), and the tetraalkylammonium hydroxide (TAAOH) may be identical to those used for preparing the coating liquid A or coating liquid B. As for the tetraalkylammonium hydroxide (TAAOH) to be used for preparing the coating liquid C, like in the case of preparing the coating liquid A or the coating liquid B, it is preferable to subject the tetraalkylammonium hydroxide on the market (which often contains some impurities) to the ion exchange treatments using a cation exchange resin and also using an anion exchange resin for removing the impurities contained therein. By the ion exchange treatments, each content of the compounds of alkali metal elements such as sodium (Na) and potassium (K) is reduced to 50 ppb by weight or below as the element base respectively, and also each content of the compounds of halogen elements such as bromine (Br) and chlorine (Cr) is reduced to 1 ppm by weight or below as the element base respectively.

In the liquid composition which corresponds to the coating liquid C, a molar ratio (BTASA/AS) between the bis(trialkoxysillyl)alkane (BTASA) and the alkoxysilane (AS) is, like in the case of the coating liquid B, in the range from 7/3 to 3/7, and more preferably in the range from 6/4 to 4/6 in terms of $SiO_2$.

Furthermore, a molar ratio ((BTASA+AS)/TAOS) between a total amount of the bis(trialkoxysillyl)alkane (BTASA) and the alkoxysilane (AS), and tetraalkyl orthosilicate (TAOS), as components for forming the silica-based coating film is in the range from 99/1 to 50/50, preferably in the range from 99/1 to 70/30, and more preferably in the range from 90/10 to 70/30 in terms of $SiO_2$.

Moreover, a molar ratio (TAAOH/(BTASA+AS+TAOS)) between the tetraalkylammonium hydroxide (TAAOH) and a total amount of the bis(trialkoxysillyl) alkane (BTASA), the alkoxysilane (AS) and the tetraalkyl orthosilicate (TAOS) is in the range from 1/10 to 6/10, and preferably in the range from 2/10 to 4/10 in terms of $SiO_2$.

For preparing the liquid composition (i.e., coating liquid C), the method described in Patent document 4 may be employed. A representative example of the method for preparing the coating liquid C is described below.

(i) The bis(trialkoxysillyl)alkane (BTASA), the alkoxysilane (AS), and the tetraalkyl orthosilicate (TAOS) are mixed with an organic solvent, and the resultant mixture solution is agitated at a temperature in the range from 10 to 30° C. and at a rotating speed in the range from 100 to 200 rpm until the components are fully mixed with each other.

(ii) Then, an aqueous solution of the tetraalkylammonium hydroxide (TAAOH) is dripped in the mixture solution under agitation over 5 to 20 minutes, and then the resultant solution is agitated for 30 to 90 minutes at a temperature in the range from 10 to 30° C. and at a rotating speed in the range from 100 to 200 rpm.

(iii) Then, the mixture solution is heated to a temperature in the range from 40 to 80° C., and then is agitated at the temperature for 1 to 72 hours at the rotating speed from 100 to 200 rpm to prepare a liquid composition containing hydrolysate of organic silicon compounds obtained by hydrolyzing the bis(trialkoxysillyl)alkane (BTASA), the alkoxysilane (AS), and the tetraalkyl orthosilicate (TAOS).

In this preparing method, the bis(trialkoxysillyl)alkane (BTASA), the alkoxysilane (AS), the tetraalkyl orthosilicate (TAOS), and the tetraalkylammonium hydroxide (TAAOH) are mixed or added at the molar ratios as described above respectively.

The same organic solvent as that used for preparing the coating liquid B may be used also in this preparing method. The organic solvents mixed with the bis(trialkoxysillyl)alkane (BTASA), the alkoxysilane (AS), and the tetraalkyl orthosilicate (TAOS) respectively may be different from each other on the condition that the type (such as alcohols) is identical, but the same organic solvent should preferably be used.

Although there is no specific restriction over a quantity of the organic solvent to be used in this preparing method, the mixing weight ratio (Organic solvent/(BTASA+AS+TAOS) between the organic solvent and the components for forming the silica-based coating film (i.e., BTASA, AS and TAOS) is, like in the case of preparing the coating liquid B, in the range from 1/1 to 3/1, and preferably in the range from 1/1 to 2.5/1.

The aqueous solution of the tetraalkylammonium hydroxide (TAAOH) to be dripped in the mixture solution preferably contain, like in the case of preparing the coating liquid B, the tetraalkylammonium hydroxide (TAAOH) by 5 to 40% by weight, preferably by 10 to 30% by weight, in distilled water or ultra-pure water.

The hydrolysis reaction is preferably carried out, like in the case of preparing the coating liquid B, for 1 to 72 hours, preferably for 10 to 48 hours at a temperature in the range from 40 to 80° C., preferably at a temperature in the range from 50 to 80° C. with agitation.

A number average molecular weight of the hydrolysate of organic silicon compounds (i.e., BTASA, AS and TAOS) contained in the liquid composition obtained as described above is preferably like in the case of coating liquid A in the range from 3,000 to 70,000, and more preferably in the range from 5,000 to 50,000 in terms of polyethylene oxide.

The liquid composition obtained by the method as described above may be used for forming the coating film as it is, but like in the cases described above, the liquid composition is preferably subjected to the solvent substitution process to replace the organic solvent contained in the liquid composition with an organic solvent selected from propylene glycol monopropylene ether (PGP), propylene glycol monomethylether (PGME), propylene glycol monoethylether acetate (PGMEA) or the like by using a rotary evaporator or other equipment.

Furthermore, it is preferable to adjust a content of the hydrolysate of organic silicon compounds contained in the liquid composition obtained as described above to the range from 1 to 20% by weight, preferably to the range from 1 to 10% by weight in terms of $SiO_2$, like in the case of preparing the coating liquid B.

There is no specific restriction over a quantity of water contained in the liquid composition, but the water content is preferably 60% by weight or below to the total amount of the liquid composition, and more preferably in the range from 0.1 to 50% by weight.

The organic solvent is a remnant component (i.e., balancing component) constituting the liquid composition, and there is no specific restriction over the content, but the content of the organic solvent in the liquid composition is preferably in the range from 20 to 99% by weight. In this preparing method, the content of the organic solvent as used herein means a total content of the organic solvent (e.g., propylene glycol monopropylether or the like) used in the solvent substitution process and the organic solvent (such as ethanol) having been not replaced with the above organic solvent and remaining in the liquid composition.

When the contents of water and organic solvent are in the ranges as described above respectively, it is possible to obtain a liquid composition (i.e., coating liquid C) for forming an amorphous silica-based coating film with the low dielectric constant of 3.0 or below and having the high film strength.
(B) Formation of an Amorphous Silica-Based Coating Film with a Low Dielectric Constant The method for forming on a substrate an amorphous silica-based coating film with a low dielectric constant according to the present invention is characterized particularly in that a coating film is heated with use of a superheated steam, and is classified into three types of methods as described below.
(1) First Method The first method according to the present invention provides a method of forming on a substrate an amorphous silica-based coating film with a low dielectric constant of 3.0 or below and also having a high film strength, which comprises the steps of:

(a) coating on the substrate a liquid composition containing hydrolysate of an organic silicon compound or compounds hydrolyzed in the presence of tetraalkylammonium hydroxide (TAAOH) (i.e., coating step);

(b) setting the substrate in a chamber, and then drying a coating film formed on the substrate at a temperature in the range from 25 to 340° C. (i.e., drying step);

(c) heating the coating film at a temperature in the range from 105 to 450° C. with introduction of a superheated steam having such a temperature into the chamber (i.e., heating step); and (d) curing the coating film at a temperature in the range from 350 to 450° C. with introduction of a nitrogen gas into the chamber (i.e., curing step).

The following is a detailed explanation for each step as described above.
Coating Step In general, coating methods such as a spin coating method, a dip coating method, a roll coating method, and a transfer method are employed for coating a coating liquid for forming a coating film on a substrate, and also in the present invention, it is possible to coat the liquid composition on a substrate by any of the conventional methods as described above. Of these methods, the spin coating method is preferable when the liquid composition is coated on a semiconductor substrate, because the method can provide a coating film with a uniform thickness and generates dusts little. Therefore, it is preferable to employ the spin coating method in the present invention, but when the liquid composition is coated on a semiconductor substrate with a large diameter, for instance, the transfer method is preferably employed.

In the present invention, "coating a liquid composition on s substrate" means not only directly coating the liquid composition on a substrate such as a silicon wafer, but also coating the liquid composition on a protection film for mechanical processing of a semiconductor or other types of coating films formed on the substrate.
Drying Step In this step, the substrate obtained in the coating step is set in a chamber, and the coating film formed on the substrate is heated at a prespecified temperature or temperatures, namely at a temperature in the range from 25 to 340° C., preferably from 100 to 250° C. for drying the coating film. When the drying step is carried out at a temperature lower than 25° C., most of the organic solvent and water contained in the coated film does not vaporize, and remains in the coating film. In this case, the objective of the drying step may not be achieved, and sometimes a thickness of the coating film may be inhomogeneous. On the other hand, when the drying step is carried out at a temperature higher than 340° C. even for a short period of time, most of the organic solvent and water contained in the coating film is vaporized rapidly. In addition, because decomposition of tetraalkylammonium hydroxide (TAAOH) starts and the decomposed materials vaporize and fall out from the film together with the components as described above, sometimes pores having relatively large diameters or voids are generated in the coating film. Furthermore, when the heating is performed in the subsequent heating step, because a proper shrinkage is not given to the coating film formed in the heating step, sometimes the film strength may become lower. In addition, a specific dielectric constant of the formed coating film may become higher. From the points of view, it is much preferable to carry out the drying step at a temperature in the range from 100 to 200° C.

The operation in the drying step is preferably carried out for 0.5 to 10 minutes, more preferably for 2 to 5 minutes at a temperature in the range from 25 to 340° C., more preferably at a temperature in the range from 100 to 250° C. with introduction of a nitrogen gas or air in the chamber. When the time for drying is shorter than 0.5 minutes, the coating film is not dried sufficiently, and when the time is over 10 minutes, a surface of the coating film is hardened, and in this case, even if the tetraalkylammonium hydroxide (TAAOH) is decomposed in the subsequent heating step, the decomposed materials are not fallen out from the coating film, which is not preferable. In this step, the nitrogen gas or air to be introduced in the chamber is not always required to heat up in advance, if the coating film formed on the substrate can be heated up to the above temperature by using a heating source such as a sheet-fed hot plate. The skin temperature of the sheet-fed hot plate is often regarded as the heating temperature as described above.

As the heating device, it is possible to use a heating device (or a heating furnace) based on the batch operation system or continuous operation system which is generally used in, for instance, the semiconductor industry, but it is preferable to use a heating device with a chamber in which the substrate is placed on a sheet-fed hot plate for drying, heating, and curing.

The operation in the drying step may be performed not only in a nitrogen gas atmosphere, but also in an air atmosphere. In this drying step, the air atmosphere is acceptable, because the operation is performed for a short period of time at a relatively low temperature, namely at a temperature lower than 340° C. and damages such as oxidation of metal are hardly given to metallic wiring provided on a semiconductor substrate even when the drying step is carried out in the atmosphere of air containing a relatively large quantity of oxygen.

Furthermore, by continuously introducing a nitrogen gas or air into a chamber of the heating device, it is possible to easily discharge the organic solvent and water vaporized from the coating film to the outside.

Heating Step

In this step, the coating film having been subjected to the drying step is heated at a temperature in the range from 105 to 450° C., preferably in the range from 250 to 350° C. with introduction of a superheated steam having such a temperature in the chamber. When the heating step is carried out at a temperature lower than 105° C., the tetraalkylammonium hydroxide (TAAOH) is hardly decomposed and remains in the coating film, which may cause increase of a specific dielectric constant or give negative influence to performance of a semiconductor substrate. On the other hand, when the heating step is carried out at a temperature higher than 450° C., sometimes an aluminum wiring or a copper wiring provided on the semiconductor substrate may be damaged. Therefore, it is preferable, in this heating step, to gradually decompose and vaporize all of the tetraalkylammonium hydroxide (TAAOH) and also to proceed with gradual polymerization of the components for forming the silica-based coating film (with formation of the —O—Si—O—Si— network) for getting the coating film with a proper shrinkage. From the points of view, it is much preferable to carry out the heating step at a temperature in the range from 250 to 350° C.

The operation in the heating step is preferably carried out for 1 to 70 minutes, more preferably for 10 to 60 minutes at a temperature in the range from 105 to 450° C., more preferably at a temperature in the range from 250 to 350° C. with introduction of a superheated stem having such a temperature in the chamber. When the time for heating is less than one minute, the tetraalkylammonium hydroxide (TAAOH) is not sufficiently decomposed and vaporized, and when the time for heating is over 70 minutes, the tetraalkylammonium hydroxide (TAAOH) is completely decomposed and vaporized, and therefore it is not advantageous to continue the operation any more. In this step, it is preferable that the coating film formed on the substrate is further heated by using a heating source such as a sheet-fed hot plate, and the skin temperature thereof is often regarded as the heating temperature as described above.

Furthermore, the operations in the drying step and in the heating step are desirable to carry out in such conditions that the coating film obtained from the heating step or the subsequent curing step has a volume with a shrinkage of 5 to 40%, preferably 5 to 20% as against the volume of the coating film formed in the coating film. When the shrinkage rate is less than 5%, it becomes difficult to obtain a coating film having a high film strength (as Young's modulus), and when the shrinkage rate is over 40%, a specific dielectric constant of the obtained coating film tends to become higher.

In the first method of forming a coating film according to the present invention, the coating film obtained from the heating step is further heated in the subsequent curing step as described below. Therefore, if the coating film obtained from the curing step is formed with such a shrinkage rate as described above, the requirement for this matter is satisfied, although the shrinkage rate in the curing step is rather small.

As for the superheated steam, when a saturated steam (having a temperature of about 100° C.) generated in a steam boiler (e.g., Steam Boiler US-MG12SP manufactured by UCAN Corp.) is further heated by using a superheated steam generator developed with use of new technologies such as a high frequency induction heating (e.g., Super-Hi manufactured by Japan High Frequency Industry Inc.), it is easy to obtain a superheated steam having a temperature of from 105 to 800° C.

The superheated steam obtained as described above has a high radiation heat, and therefore all portions of the coating film (including the inside of the film) can homogeneously be heated by the effect of the radiation heat. Therefore, the temperature of the superheated steam using in the heating step may be selected from a temperature which is close to the temperature for decomposition of the tetraalkylammonium hydroxide (TAAOH), although the temperature to be actually selected varies dependant upon a type and a quantity of the tetraalkylammonium hydroxide (TAAOH) contained in the liquid composition. Namely, although the time required for the heating step become slightly longer, the heating step may be carried out at a temperature slightly higher than the decomposition temperature of the tetraalkylammonium hydroxide (TAAOH). As for the decomposition temperature of the tetraalkylammonium hydroxide (TAAOH), it is generally known that the decomposition temperature of tetramethyl ammonium hydroxide, tetraethyl ammonium hydroxide, and the like is in the range from about 110 to 140° C. and that for tetrapropyl ammonium hydroxide, tetrabutyl ammonium hydroxide and the like is in the range from about 140 to 200° C. Notwithstanding, it has been observed during the operation in the heating step that decomposition of the compound is started at a temperature slightly lower than the decomposition temperatures (for instance, at 105° C. for tetramethyl ammonium hydroxide). However, whether the phenomenon occurs due to the influence by radiation heat of the superheated steam or not has not been clarified yet.

Even when a saturated steam used in the inventions described in Patent document 5 or Patent document 6 is employed, the effect by radiation heat of the steam can be expected to some extent, but a specific dielectric constant of the coating film obtained in the case of using the steam becomes higher than that in the case of using the superheated steam and also the film strength (as Young's modulus) thereof becomes lower than that in the case of using the superheated steam, which are not preferable. When the coating film dried at a relatively lower temperature is subjected to the processing with the steam, a specific dielectric constant of the obtained coating film tends to become higher. On the other hand, when the drying step is carried out at a relatively higher temperature, the coating film obtained with use of the steam tends to have pores with relatively larger diameters (such as mesopores). In that case, although a specific dielectric constant of the obtained coating film becomes relatively lower, but the shrinkage rate of the coating film is not so high, and therefore the film strength (as Young's modulus) tends to become lower. Furthermore, the coating film subjected to the processing with steam as described above has a lower resistance against oxygen plasma, which is disadvantageous. Therefore, only subjecting to the drying step and the heating step using the steam as described above, it is difficult to stably obtain a coating film having physical properties to be desired.

Curing Step

In this step, the coating film having been subjected to the heating step is cured at a temperature in the range from 350 to 450° C., preferably at a temperature in the range from 380 to 410° C. with introduction of a nitrogen gas in the chamber. When the curing step is carried out at a temperature lower than 350° C., an additional polymerization of components for forming the silica-based coating film (with formation of the —O—Si—O—Si— network) does not proceed smoothly and a coating film having a sufficient film strength is hardly obtained. When the curing step is carried out at a temperature higher than 450° C., aluminum wiring or copper wiring provided on a semiconductor substrate may be oxidized or melted, which may give fatal damage to the wiring layer. From the points of view, it is much preferable to carry out the curing step at a temperature in the range from 380 to 410° C. In this step, the nitrogen gas or air to be introduced in the chamber is not always required to heat up in advance, if the coating film formed on the substrate can be heated up to the above temperature by using a heating source such as a sheet-fed hot plate. The skin temperature of the sheet-fed hot plate is often regarded as the heating temperature as described above.

The operation in the curing step is preferably carried out for 5 to 90 minutes, more preferably for 10 to 60 minutes at a temperature in the range from 350 to 450° C., more preferably at a temperature in the range from 380 to 410° C. with introduction of a nitrogen gas in the chamber. When the time for the curing step is less than 5 minutes, an additional polymerization of components for forming the silica-based coating film (with formation of the —O—Si—O—Si— network) does not proceed sufficiently, although it varies dependant upon the heating conditions such as the temperature adopted in the heating step. When the time is over 90 minutes, an additional polymerization of components for forming the silica-based coating film proceeds sufficiently and the —O—Si—O—Si—network (with a three-dimensionally bridging structure) is constructed. Therefore, it is meaningless to continue the curing operation any more.

It is not always required to use a nitrogen gas with the nitrogen content of 100%. It is allowable to use, for instance, the inert gas described in the previous patent application by the present applicant (International Patent Publication No. WO 01/48806), namely the nitrogen gas contains oxygen by about 500 to 1000 ppm by volume which is produced by adding a small quantity of air or an oxygen gas to a nitrogen gas procurable from the market.

The substrate having been subjected to the curing step is preferably left in the chamber and then taken out to the outside after the temperature in the chamber is cooled down to the room temperature or a temperature close to the room temperature. In this case, a nitrogen gas or air having a temperature close to the room temperature or below may be introduced into the chamber to lower the temperature therein after the heating by a heating source such as a sheet-fed hot plate has been stopped.

A thickness of the silica-based coating film formed on the substrate varies dependent upon a type or an application of the substrate on which the coating film is formed, but the thickness is in the range from 100 to 600 nm on a silicon substrate (silicon wafer) for a semiconductor device, and in the range from 100 to 1000 nm between wiring layers for multilayered wiring.

(2) Second Method

The second method according to the present invention provides a method of forming on a substrate an amorphous silica-based coating film with a low dielectric constant of 3.0 or below and also having a high film strength, which comprises the steps of:

(a) coating on the substrate a liquid composition containing hydrolysate of an organic silicon compound or compounds hydrolyzed in the presence of tetraalkylammonium hydroxide (TAAOH) (i.e., coating step);

(b) setting the substrate in a chamber, and then drying a coating film formed on the substrate at a temperature in the range from 25 to 340° C. (i.e., drying step); and (c) heating the coating film at a temperature in the range from 105 to 450° C. with introduction of a superheated steam having such a temperature into the chamber (i.e., heating step).

The above steps are as described in the steps (a), (b) and (c) of the first method, and therefore detailed descriptions for such steps are omitted herefrom.

In the second method, the curing step is excluded from the first method, and therefore a film strength (as Young's modulus) of the obtained silica-based coating film is slightly lower, but different from other known methods. As a proper shrinkage of the coating film occurs in the drying step and in the heating step, it is possible to form an amorphous silica-based coating film with a low dielectric constant and also having a sufficient film strength. However, in the second method, the heating step is preferably carried out at a relatively higher temperature than that of the first method, for instance, at a temperature of 250° C. or more (namely in the range from 250 to 450° C.).

(3) Third Method

The third method according to the present invention provides a method of forming on a substrate an amorphous silica-based coating film with a low dielectric constant of 3.0 or below and also having a high film strength, which comprises the steps of:

(a) coating on the substrate a liquid composition containing hydrolysate of an organic silicon compound or compounds hydrolyzed in the presence of tetraalkylammonium hydroxide (TAAOH) (i.e., coating step); and (b) setting the substrate in a chamber, and then heating a coating film formed on the substrate at a temperature or temperatures in the range from 105 to 450° C. with introduction of a superheated steam having such a temperature into the chamber (i.e., heating step).

The above steps are as described in the steps (a) and (c) of the first method, although the temperature to be employed in the heating step may be different, and therefore detailed descriptions for such steps are omitted.

In the third method, the drying step and the curing step are excluded from the first method, and therefore a film strength (as Young's modulus) of the obtained silica-based coating film is somewhat lower than those obtained by the above methods, but different from other known methods. As a proper shrinkage of the coating film occurs in the heating step, it is possible to form an amorphous silica-based coating film having a sufficient film strength.

In the third method, if the heating step is carried out at a high temperature from the beginning, not only an organic solvent and water contained in the coating film formed by coating the liquid composition is vaporized all at once, but also the tetraalkylammonium hydroxide (TAAOH) is decomposed and vaporized rapidly, and then fallen out from the coating film, which is not preferable. In addition, the organic components discharged to the outside (i.e., the organic solvent and also the decomposed materials of tetraalkylammonium hydroxide) smell bad substantially.

In the third method according to the present invention, it is preferable to carry out the operation in the heating step for 1 to 20 minutes at a temperature in the range from 105 to 130° C. and then for 1 to 70 minutes at a temperature in the range from 130 to 450° C. with introduction of a superheated steam having such a temperature into the chamber. It is also acceptable that the temperature for the heating step may gradually be raised. When the heating at two stages as described above is employed, even if the drying step is excluded, it is possible to obtain a coating film having the physical properties almost equivalent or close to those of the coating film obtained by the second method as described above. However, even when the heating step is carried out at a relatively high temperature from the beginning, it is possible to obtain a coating film having the physical properties superior than or close to those of the coating films obtained by any conventional method (comprising the drying step and the curing step). Namely, in the present invention, the heating step can be carried out by two or more stages as described above, but also by one stage at a specific temperature.

[Amorphous Silica-Based Coating Film with a Low Dielectric Constant]

The amorphous silica-based coating film with a low dielectric constant according to the present invention has, when formed by the methods as described above, the specific dielectric constant of 3.0 or below, preferably of 2.5 or below and the film strength, as expressed by Young's modulus, of 3.0 GPa or more, preferably of 5.0 GPa or more. Furthermore, with the methods as described above, it is possible to easily form a silica-based coating film containing micropores having an average diameter of 3 nm or below therein and with a percentage of micropores having the diameter of 2 nm or below being 70% or more. The micropores contained in the coating film are important factors for giving the low specific dielectric constant and the high film strength as described above. Therefore, the present invention can stably provide the silica-based coating film conforming to the recent requirements from the semiconductor manufacturers.

Furthermore, with the methods as described above, it is possible to easily form a silica-based coating film having a smooth surface with the surface roughness (Rms) of 1 nm or below. The surface roughness means a square average of values obtained by measurement with an atom force microscope (AFM). Because of the features as described above, it is not always required to carry out the complicated process of mechanical and chemical polishing for flattening a surface of a coating film formed on a substrate, which enables to eliminate the defects of known zeolite-based coating films.

In addition, the silica-based coating film obtained by the method according to the present invention is excellent in the hydrophobicity (i.e., moisture resistance), and therefore even if the silica-based coating film is left in atmospheric air containing a saturated steam, the specific dielectric constant is hardly deteriorated (namely the specific dielectric constant does not increase), which is different from the zeolite-based coating films. Therefore, it is not required to carry out silylation or the like as required for the zeolite-based coating film. Furthermore, the silica-based coating film according to the present invention is an amorphous silica-based coating film not having the X-ray diffraction peak caused by the MFI crystalline structure as observed in the zeolite-based coating films.

Moreover, the silica-based coating film according to the present invention has, in addition to the characteristics described above, other excellent characteristics such as strong adhesiveness to a surface of a semiconductor substrate or the like on which the coating film is formed, high chemical resistance such as alkali resistance and high resistance against cracking, and also has excellent adaptability to processing such as resistance against oxygen plasma and workability by etching.

Because of the features as described above, the silica-based coating film according to the present invention is formed, for its use, on a semiconductor substrate, on wiring layers with a multilayered wiring structure, on an element surface and/or on a PN junction section provided on the substrate, or between the multilayered wiring layers provided on the substrate. Of these applications, the silica-based coating film is especially used as an inter-layer insulating film to be formed on a semiconductor substrate or the like.

EXAMPLES

Examples of the present invention are described in detail below, but the present invention is not limited to the examples. In addition, the coating liquids prepared in Preparation of Liquid Composition A to C as described below are indicated as only examples of the liquid compositions used in the present invention.

[Preparation of Liquid Composition A]

300 g of a cation exchange resin powder (WK-40 produced by Mitsubishi Chemicals Corp.) was added to 1 kg of an aqueous solution containing tetrapropyl ammonium hydroxide by 40% by weight (TPAOH produced by Lion Corporation) procured from the market, and the mixture solution was agitated for 1 hour at the rotating speed of 100 rpm at the room temperature. Then, the cation exchange resin powder was removed by filtering. Then, 2100 g of an anion exchange resin powder (SAT-10 produced by Mitsubishi Chemicals Corp.) was added to the mixture solution, and the resultant mixture solution was agitated for 1 hour at the rotating speed of 100 rpm. Then, the anion exchange resin powder was removed by filtering.

Ultra pure water was added to the obtained aqueous solution of tetrapropyl ammonium hydroxide (TPAOH) to adjust the concentration of tetrapropyl ammonium hydroxide (TPAOH) to 10% by weight, and each quantity of the compounds of alkali metal elements such as sodium (Na) and potassium (K) and each quantity of the compounds of halogen elements such as bromine (Br) and chlorine (Cl), which were contained in the aqueous solution as impurities, were measured by the atomic absorption method (AAS method with the polarized Zeeman atomic absorption photometer Z-5710 produced by Hitachi Inc.) and the ion chromatography method (with 2020i produced by DIONEX).

Furthermore, ultrapure water was added to the aqueous solution of tetrapropyl ammonium hydroxide (procured from the market) not having been subjected to the ion exchange treatments to adjust the concentration of the tetrapropylammonium hydroxide to 10% by weight, and each quantity of the impurities contained in the aqueous solution were measured as described above.

As a result, each quantity of the impurities contained in the aqueous solution not having been subjected to the ion exchange treatments was 50 ppm by weight for sodium, 2500 ppm by weight for potassium, 2250 ppm by weight for bromine, and 13 ppm by weight for chlorine as the element base respectively, but each quantity of the impurities after subjected to the ion exchange treatments was below 10 ppb by weight for sodium (which is on the limitation line for detection), below 10 ppb by weight for potassium (which is on the limitation line for detection), below 1 ppm by weight for bromine, and below 1 ppm by weight for chlorine as the element base respectively. Namely, the aqueous solution of tetrapropyl ammonium hydroxide (procured from the market) was purified up to the allowable impurity level required in the present invention.

89.3 g of tetraethyl orthosilicate (TEOS, produced by Tama Chemical Industry Corp.), 56.8 g of methyl trimethoxysilane (MTMS, produced by Shin-Etsu Chemical Corp. Ltd.), and 260.7 g of ethanol with the concentration of 99.5% by weight (ETOH, produced by Wako Pure Chemicals Industries Ltd.) were mixed together, and the mixture solution was kept at 20° C. and agitated for 30 minutes at the rotating speed of 150 rpm.

593.2 g of the highly purified aqueous solution of tetrapropyl ammonium hydroxide (containing TPAOH by 10% by weight) was dripped into this mixture solution over 10 minutes, and the resultant mixture solution was agitated for one hour at 20° C. and at the rotating speed of 200 rpm. Then, the mixture solution was heated to 50° C., and agitated for 20 hours at the temperature and the rotating speed of 200 rpm to hydrolyze the organic silicon compounds (i.e., TEOS and MTMS) as the components for forming a silica-based coating film.

Then, the mixture solution containing hydrolysate of the organic silicon compounds was subjected to the solvent substitution process with a rotary evaporator (R-114 produced by Shibata Scientific Technology Ltd.) to replace ethanol (organic solvent) with propylene glycol monopropylether (PGP produced by Nippon Nyukazai Co. Ltd.) and adjusted the contents of water and the silicon compounds substantially consisting of the hydrolysate of tetraethyl orthosilicate (TEOS) and methyl trimethoxysilane (MTMS), by which 416.73 g of a liquid composition containing the silicon compounds by 12% by weight in terms of $SiO_2$ and water by 1% by weight (hereinafter referred to as "liquid composition A") was obtained.

The number average molecular weight of the silicon compounds (i.e., hydrolysate of TEOS and MTMS) contained in the liquid composition obtained as described above was measured by the liquid chromatography method. As a result, the number average molecular weight was about 15,000 in terms of polyethylene oxide.

[Preparation of Liquid Composition B]

22.5 g of bis(triethoxysillyl)ethane (BTESE, produced by GELEST), 52.5 g of methyl trimethoxysilane (MTMS, produced by Shin-Etsu Chemical Industry Corp.), and 147 g of ethanol with the concentration of 99.5% by weight (ETOH, produced by Wako Pure Chemicals Industries Ltd.) were mixed together, and the mixture solution was kept at 20° C., and was agitated for 30 minutes at the rotating speed of 30 minutes.

417 g of the highly purified tetrapropyl ammonium hydroxide (containing TPAOH by 10% by weight) prepared in the Preparation of Liquid Composition A was dripped over 10 minutes into this mixture solution, and the resultant mixture solution was further agitated for one hour at 20° C. and at the rotating speed of 200 rpm. Then, the mixture solution was heated to 75° C., and was agitated for 20 hours at the temperature and at the rotating speed of 200 rpm to hydrolyze the organic silicon compounds (i.e., BTESM and MTMS) as the components for forming a silica-based coating film.

Then, the mixture solution containing hydrolysate of the organic silicon compounds was subjected to the solvent substitution process with a rotary evaporator (R-114 produced by Shibata Scientific Technology Ltd.) to replace ethanol (organic solvent) with propylene glycol monopropylether (PGP produced by Nippon Nyukazai Co. Ltd.) and adjusted the contents of water and the silicon compounds substantially consisting of the hydrolysate of bis(triethoxysillyl)methane (BTESM) and methyl trimethoxysilane (MTMS), by which 554 g of a liquid composition containing the silicon compounds by 6% by weight in terms of $SiO_2$ and water by 0.5% by weight (hereinafter referred to as "liquid composition B") was obtained.

The number average molecular weight of the silicon compounds (i.e., hydrolysate of BTESM and MTMS) contained in the liquid composition obtained as described above was measured by the liquid chromatography method. As a result, the number average molecular weight was about 21,000 in terms of polyethylene oxide.

[Preparation of Liquid Composition C]

14 g of bis(triethoxysillyl)ethane (BTESE produced by GELEST), 21 g of methyl trimethoxysilane (MTMS produced by Shin-Etsu Chemical Corp. Ltd.), 24 g of tetraethyl orthosilicate (TEOS, Tama Chemical Industry Corp.), and 98 g of ethanol with the concentration of 99.5% by weight (ETOH, Wako Pure Chemicals Industries Ltd.) were mixed together, and the mixture solution was kept at 20° C. and was agitated for 30 minutes at the rotating speed of 150 rpm.

278 g of the highly purified aqueous solution of tetrapropyl ammonium hydroxide prepared in the Preparation of Liquid Composition A (containing TPAOH by 10% by weight) was dripped over 10 minutes into this mixture solution, and the resultant mixture solution was agitated for 1 hour at 20° C. and at the rotating speed of 200 rpm. Then, the mixture solution was heated to 75° C., and was agitated for 20 hours at the temperature and at the rotating speed of 200 rpm to hydrolyze the organic silicon compounds (i.e., BTESE, MTMS and TEOS) as the components for forming a silica-based coating film.

Then, the mixture solution containing hydrolysate of the organic silicon compounds was subjected to the solvent substitution process with a rotary evaporator (R-114 produced by Shibata Scientific Technology Ltd.) to replace ethanol (organic solvent) with 500 g of propylene glycol monopropylether (PGP produced by Nippon Nyukazai Co. Ltd.) and adjusted the contents of water and the silicon compounds substantially consisting of the hydrolysate of bis(triethoxysyllyl)ethane (BTESE), methyl trimethoxysilane (MTMS) and tetraethyl orthosilicate (TEOS), by which 371 g of a liquid composition containing the silicon compounds by 6% by weight in terms of $SiO_2$ and water by 4% by weight (hereinafter referred to as "liquid composition C") was obtained.

The number average molecular weight of the silicon compounds (i.e., hydrolysate of BTESE, MTMS and TEOS) contained in the liquid composition obtained as described above was measured by the liquid chromatography method. As a result, the number average molecular weight was about 17,000 in terms of polyethylene oxide.

Example 1 and Comparative Example 1

5 ml of each of the liquid compositions A, the liquid composition B, and the liquid composition C prepared in the Preparation of Liquid Composition A to C as described above was dripped by the well-known spin coating method (by using ACT-8 produced by Tokyo Electron Co. Ltd.) onto a 8-inch size silicon wafer substrate and coated on the substrate at the rotating speed of 2000 rpm for 20 seconds. The operation was repeated to obtain plural number of the substrate 1A, the substrate 1B, and the substrate 1C coated by the liquid composition A, the liquid composition B, and the liquid composition C respectively.

Then, the substrates were placed on a sheet-fed hot plate (ACT-8 produced by Tokyo Electron Co. Ltd.) set in a chamber of the heating device and the coating films (i.e., the coated films) formed on the substrates were dried for 3 minutes at a temperature as shown in Table 1 with introduction of a nitrogen gas at the rate of about 10 l/min. In this step, the organic solvent (PGP) and water contained in the coating films were vaporized and fallen out from the film, and then discharged to the outside together with the nitrogen gas introduced.

The substrates were left as placed on the sheet-fed hot plate and the coating films formed on the substrates (i.e., the dried coating films) were heated for 30 minutes at a temperature of 250° C. with introduction of a superheated steam having the temperature of 250° C. obtained from a superheated steam generator (Super-Hi produced by Japan High Frequency Industry Co. Ltd.) at the rate of about 10 l/min. In this step, the water and organic solvent (PGP) remained in the coating films and the decomposed materials of tetrapropylammonium hydroxide or the like contained in the film were vaporized and fallen out from the coating film, and then discharged to the outside together with the superheated steam introduced.

Furthermore, the substrates were left as placed on the sheet-fed hot plate, and the coating films (i.e., the heated coating films) formed on the substrates were cured for 30 minutes at a temperature of 400° C. with introduction of a nitrogen gas at the rate of about 10 l/min. Then, the substrates were cooled down to a temperature close to the room temperature and taken out to the outside.

The following parameters of the silica-based coating films formed on the substrates 1A, 1B, and 1C obtained as described above were measured: (i) a specific dielectric constant (by the mercury probe method using SSM 495 produced by Solid State Measurements at the frequency of 1 MHz), (ii) change in a moisture adsorption rate of the coating film immediately after irradiation of oxygen plasma (by the Thermal Desorption Mass-Spectroscopy Method using EMD-1000 produced by Electronic Science Corp.), and (iii) a film strength (Young's modulus by the nano indentation method using Nano Indenter XP produced by MTS Systems Corp.). Furthermore, the thicknesses of the coating films formed on the substrates 1A, 1B, and 1C obtained from the coating step (i.e., the coated films), and the thicknesses of the coating films formed on the substrates 1A, 1B, and 1C obtained from the curing step (i.e., the cured films) were measured by the spectroscopic ellipsometry method (using the spectroscopic ellipsometer ESVG produced by SOPRA Corp.), and then the shrinkage rates by volume of the coating films formed on the substrates by subjecting to the drying step, the heating step, and the curing step as against the volume of the coating film formed in the coating step were calculated. The measurement results are shown in Table 1.

Of these measurement results, the specific dielectric constant, the film strength, and the shrinkage rate of the coating film formed on each of the substrate 1A are shown as graphs in FIG. 1, FIG. 2, and FIG. 3 respectively.

As a result, it was found that the temperature for the drying step is required to be in the range from 25 to 340° C., preferably in the range from 100 to 250° C. It was further found that the most preferable temperature for the drying step is around 150° C.

The measurement methods and the devices for measurement and analysis used in Example 1 were also employed in the examples and the comparative examples as described below.

TABLE 1

| | | Example 1 | | | | | | | | | | Comparative Example 1 |
|---|---|---|---|---|---|---|---|---|---|---|---|---|
| Drying Step | Temperature (° C.) | 25 | 60 | 90 | 120 | 150 | 170 | 190 | 250 | 300 | 350 | 400 |
| | Gas atmosphere | Nitrogen gas | | | | | | | | | | |
| | Supply rate (l/min) | 10 | | | | | | | | | | |
| | Processing time (min) | 3 | | | | | | | | | | |
| Heating Step | Temperature (° C.) | 250 | | | | | | | | | | |
| | Gas atmosphere | Superheated steam | | | | | | | | | | |
| | Supply rate (l/min) | 10 | | | | | | | | | | |
| | Processing time (min) | 30 | | | | | | | | | | |
| Curing Step | Temperature (° C.) | 400 | | | | | | | | | | |
| | Gas atmosphere | Nitrogen gas | | | | | | | | | | |
| | Supply rate (l/min) | 10 | | | | | | | | | | |
| | Processing time (min) | 30 | | | | | | | | | | |
| Substrate 1A | A | 2.5 | 2.5 | 2.5 | 2.5 | 2.5 | 2.5 | 2.5 | 2.5 | 2.5 | 2.5 | 2.5 |
| | B | None | None | None | None | None | None | None | None | None | None | None |
| | C | 10 | 10 | 11 | 12 | 13 | 13 | 12 | 11 | 10 | 8 | 8 |
| | D | 39 | 31 | 24 | 20 | 17 | 10 | 7 | 4 | 2 | 1 | 0.3 |

TABLE 1-continued

|  |  | Example 1 | | | | | | | | | Comparative Example 1 | |
|---|---|---|---|---|---|---|---|---|---|---|---|---|
| Substrate 1B | A | 1.9 | 1.9 | 1.9 | 1.9 | 1.9 | 1.9 | 1.9 | 1.9 | 1.9 | 1.9 | 1.9 |
|  | B | None | None | None | None | None | None | None | None | None | None | None |
|  | C | 5 | 5 | 5 | 6 | 6 | 6 | 6 | 6 | 6 | 4 | 4 |
|  | D | 25 | 20 | 17 | 11 | 9 | 6 | 5 | 3 | 2 | 1 | 0.2 |
| Substrate 1C | A | 2.3 | 2.3 | 2.3 | 2.3 | 2.3 | 2.3 | 2.3 | 2.3 | 2.3 | 2.3 | 2.3 |
|  | B | None | None | None | None | None | None | None | None | None | None | None |
|  | C | 8 | 8 | 8 | 9 | 9 | 9 | 9 | 8 | 8 | 6 | 6 |
|  | D | 28 | 23 | 18 | 12 | 10 | 7 | 5 | 3 | 2 | 1 | 0.5 |

Note
A: Specific dielectric constant
B: Change in moisture adsorption rate
C: Young's modulus (GPa)
D: Shrinkage rate by volume (%)

Example 2 and Comparative Example 2

5 ml of each of the liquid compositions A, the liquid composition B, and the liquid composition C prepared in the Preparation of Liquid Composition A to C as described above was dripped by the well-known spin coating method (by using ACT-8 produced by Tokyo Electron Co. Ltd.) onto a 8-inch size silicon wafer substrate and coated on the substrate at the rotating speed of 2000 rpm for 20 seconds. The operation was repeated to obtain plural number of the substrate 2A, the substrate 2B, and the substrate 2C coated by the liquid composition A, the liquid composition B, and the liquid composition C respectively.

Then, the substrates were placed on a sheet-fed hot plate (ACT-8 produced by Tokyo Electron Corp.) set in a chamber of the heating device and the coating films (i.e., the coated films) formed on the substrates were dried for 3 minutes at a temperature of 150° C. with introduction of a nitrogen gas at the rate of about 10 l/min. The organic solvent (PGP) and water contained in the coating films were vaporized and fallen out from the film, and then discharged to the outside together with the nitrogen gas introduced.

Then, the substrates were left as placed on the sheet-fed hot plate, and the coating films (i.e., the dried films) formed on the substrates were heated for 30 minutes at a temperature as shown in Table 2 with introduction of a superheated steam having the temperature as shown in Table 2 obtained from a superheated steam generator (Super-Hi produced by Japan High Frequency Industry Co. Ltd.) at the rate of about 10 l/min. In this step, the water and the organic solvent (PGP) remained in the coating film, and the decomposed materials of tetrapropylammonium hydroxide or the like were vaporized and fallen out from the coating film, and then discharged to the outside together with the superheated steam introduced.

Furthermore, the substrates were left as placed on the sheet-fed hot plate and the coating films formed on the substrates were cured for 30 minutes at a temperature of 400° C. with introduction of a nitrogen gas at the rate of about 10 l/min. Then, the substrates were cooled down to a temperature close to the room temperature, and were taken out to the outside.

The following parameters of the silica-based coating films formed on the substrates 2A, 2B, and 2C obtained as described above were measured: (i) a specific dielectric constant, (ii) change in a moisture adsorption rate of the coating film immediately after irradiation of oxygen plasma, and (iii) a film strength, like in Example 1. Furthermore, the thicknesses of the coating films formed on the substrates 2A, 2B, and 2C obtained from the coating step (i.e., the coated films), and the thicknesses of the coating films formed on the substrates 2A, 2B, and 2C obtained from the curing step (i.e., the cured films) were measured, and then the shrinkage rates by volume of the coating films formed on the substrates by subjecting to the drying step, the heating step and the curing step were calculated, like in Example 1. The measurement results are shown in Table 2.

Of these measurement results, a specific dielectric constant of the coating film formed on each of the substrate 2A is shown as a graph in FIG. 4.

As a result, it was found that the temperature for the heating step is required to be in the range from 105 to 450° C. and preferably in the range from 250 to 350° C. It was further found that the most preferable temperature for the heating step is around 300° C.

TABLE 2

|  |  | Example 2 | | | | | | | | | | Comparative Example 2 |
|---|---|---|---|---|---|---|---|---|---|---|---|---|
| Drying Step | Temperature (° C.) | 150 | | | | | | | | | | |
|  | Gas atmosphere | Nitrogen gas | | | | | | | | | | |
|  | Supply rate (l/min) | 10 | | | | | | | | | | |
|  | Processing time (min) | 3 | | | | | | | | | | |
| Heating Step | Temperature (° C.) | 105 | 120 | 150 | 190 | 210 | 250 | 300 | 350 | 400 | 450 | 500 |
|  | Gas atmosphere | Superheated steam | | | | | | | | | | |
|  | Supply rate (l/min) | 10 | | | | | | | | | | |
|  | Processing time (min) | 30 | | | | | | | | | | |

TABLE 2-continued

| | | Example 2 | | | | | | | | | | Comparative Example 2 |
|---|---|---|---|---|---|---|---|---|---|---|---|---|
| Curing Step | Temperature (° C.) | 400 | | | | | | | | | | |
| | Gas atmosphere | Nitrogen gas | | | | | | | | | | |
| | Supply rate (l/min) | 10 | | | | | | | | | | |
| | Processing time (min) | 30 | | | | | | | | | | |
| Substrate 2A | A | 2.6 | 2.6 | 2.6 | 2.5 | 2.5 | 2.5 | 2.4 | 2.5 | 2.5 | 2.6 | 2.7 |
| | B | None | None | None | None | None | None | None | None | None | None | None |
| | C | 11 | 11 | 11 | 11 | 11 | 13 | 13 | 13 | 13 | 13 | 13 |
| | D | 10 | 11 | 12 | 14 | 16 | 17 | 16 | 17 | 17 | 17 | 19 |
| Substrate 2B | A | 2 | 2 | 2 | 1.9 | 1.9 | 1.9 | 1.8 | 1.9 | 1.9 | 2 | 2.3 |
| | B | None | None | None | None | None | None | None | None | None | None | None |
| | C | 5 | 5 | 5 | 5 | 5 | 6 | 6 | 6 | 6 | 6 | 7 |
| | D | 6 | 6 | 7 | 8 | 9 | 9 | 9 | 9 | 9 | 10 | 12 |
| Substrate 2C | A | 2.4 | 2.4 | 2.4 | 2.3 | 2.3 | 2.3 | 2.2 | 2.3 | 2.3 | 2.4 | 2.6 |
| | B | None | None | None | None | None | None | None | None | None | None | None |
| | C | 8 | 8 | 8 | 8 | 8 | 9 | 9 | 9 | 9 | 9 | 11 |
| | D | 7 | 7 | 8 | 9 | 10 | 10 | 10 | 10 | 10 | 11 | 13 |

Note
A: Specific dielectric constant
B: Change in moisture adsorption rate
C: Young's modulus (GPa)
D: Shrinkage rate by volume (%)

Example 3 and Comparative Example 3

5 ml of each of the liquid compositions A, the liquid composition B, and the liquid composition C prepared in the Preparation of Liquid Composition A to C as described above was dripped by the well-known spin coating method (by using ACT-8 produced by Tokyo Electron Co. Ltd.) onto a 8-inch size silicon wafer substrate and coated on the substrate at the rotating speed of 2000 rpm for 20 seconds. The operation was repeated to obtain plural number of the substrates 3A, the substrate 3B, and the substrate 3C coated by the liquid composition A, the liquid composition B, and the liquid composition C respectively.

Then, the substrates were placed on a sheet-fed hot plate (ACT-8 produced by Tokyo Electron Co. Ltd.) set in a chamber of the heating device and the coating films (i.e., the coated films) formed on the substrates were dried for 3 minutes at a temperature of 150° C. with introduction of a nitrogen gas at the rate of about 10 l/min. In this step, the organic solvent (PGP) and water contained in the coating films were vaporized and fallen out from the film, and then discharged to the outside together with the nitrogen gas introduced.

The substrates were left as placed on the sheet-fed hot plate and the coating films (dried coating films) formed on the substrates were heated for 30 minutes at a temperature of 250° C. with introduction of a superheated steam having the temperature of 250° C. obtained from an superheated steam generator (Super-Hi produced by Japan High Frequency Industry Co. Ltd.) at the rate of about 10 l/min. In this step, the water and the organic solvent (PGP) remained in the coating film, and the decomposed materials of tetrapropylammonium hydroxide or the like were vaporized and fallen out from the coating film, and then discharged to the outside together with the superheated steam introduced.

Furthermore, the substrates were left as placed on the sheet-fed hot plate, and the coating films formed on the substrates were cured for 30 minutes at a temperature as shown in Table 3 with introduction of a nitrogen gas at the rate of about 10 l/min. Then, the substrates were cooled down to a temperature close to the room temperature, and were taken out to the outside.

The following parameters of the silica-based coating films formed on the substrates 3A, 3B, and 3C obtained as described above were measured: (i) a specific dielectric constant, (ii) change in a moisture adsorption rate of the coating film immediately after irradiation of oxygen plasma, and (iii) a film strength, like in Example 1. Furthermore, the thicknesses of the coating films formed on the substrates 3A, 3B, and 3C obtained from the coating step (i.e., the coated films), and the thicknesses of the coating films formed on the substrates 3A, 3B, and 3C obtained from the curing step (i.e., the cured films) were measured, and then the shrinkage rates by volume of the coating films formed on the substrate by subjecting to the drying step, the heating step and the curing step were calculated, like in Example 1. The measurement results are shown in Table 3.

As a result, it was found that the temperature for the curing step is required to be in the range from 350 to 450° C. It was further found that the most preferable temperature for the curing step is around 400° C.

TABLE 3

| | | Example 3 | Comparative Example 3 |
|---|---|---|---|
| Drying Step | Temperature (° C.) | 150 | |
| | Gas atmosphere | Nitrogen gas | |
| | Supply rate (l/min) | 10 | |
| | Processing time (min) | 3 | |

TABLE 3-continued

|  |  | Example 3 |  |  |  |  |  | Comparative Example 3 |
|---|---|---|---|---|---|---|---|---|
| Heating Step | Temperature (° C.) |  |  |  | 250 |  |  |  |
|  | Gas atmosphere |  |  | Superheated steam |  |  |  |  |
|  | Supply rate (l/min) |  |  |  | 10 |  |  |  |
|  | Processing time (min) |  |  |  | 30 |  |  |  |
| Curing Step | Temperature (° C.) | 350 | 360 | 380 | 400 | 430 | 450 | 500 |
|  | Gas atmosphere |  |  | Nitrogen gas |  |  |  |  |
|  | Supply rate (l/min) |  |  |  | 10 |  |  |  |
|  | Processing time (min) |  |  |  | 30 |  |  |  |
| Substrate 3A | A | 2.5 | 2.5 | 2.5 | 2.5 | 2.5 | 2.6 | 2.8 |
|  | B | None | None | None | None | None | None | None |
|  | C | 12 | 12 | 12 | 13 | 13 | 13 | 13 |
|  | D | 17 | 17 | 17 | 17 | 17 | 17 | 19 |
| Substrate 3B | A | 1.9 | 1.9 | 1.9 | 1.9 | 1.9 | 2 | 2.3 |
|  | B | None | None | None | None | None | None | None |
|  | C | 5 | 5 | 5 | 6 | 6 | 6 | 7 |
|  | D | 9 | 9 | 9 | 9 | 9 | 10 | 12 |
| Substrate 3C | A | 2.3 | 2.3 | 2.3 | 2.3 | 2.3 | 2.4 | 2.6 |
|  | B | None | None | None | None | None | None | None |
|  | C | 8 | 8 | 8 | 9 | 9 | 9 | 11 |
|  | D | 10 | 10 | 10 | 10 | 10 | 11 | 13 |

Note
A: Specific dielectric constant
B: Change in moisture adsorption rate
C: Young's modulus (GPa)
D: Shrinkage rate by volume (%)

Example 4 and Comparative Example 4

5 ml of each of the liquid compositions A, the liquid composition B, and the liquid composition C prepared in the Preparation of Liquid Composition A to C as described above was dripped by the well-known spin coating method (by using ACT-8 produced by Tokyo Electron Co. Ltd.) onto a 8-inch size silicon wafer substrate and coated on the substrate at the rotating speed of 2000 rpm for 20 seconds. The operation was repeated to obtain plural number of the substrate 4A, the substrate 4B, and the substrate 4C coated by the liquid composition A, the liquid composition B, and the liquid composition C respectively.

Then, the substrates were placed on a sheet-fed hot plate (ACT-8 produced by Tokyo Electron Co. Ltd.) set in a chamber of the heating device and the coating films (i.e., the coated films) formed on the substrates were dried for 3 minutes at a temperature as shown in Table 4 with introduction of a nitrogen gas at the rate of about 10 l/min. In this step, the organic solvent (PGP) and water contained in the coating films were vaporized and fallen out from the film, and then discharged to the outside together with the nitrogen gas introduced.

The substrates were left as placed on the sheet-fed hot plate and the coating films (i.e., the dried films) formed on the substrates were heated for 30 minutes at a temperature of 250° C. with introduction of a superheated steam having the temperature of 250° C. obtained from an superheated steam generator (Super-Hi produced by Japan High Frequency Industry Co. Ltd.) at the rate of about 10 l/min. In this step, the water and the organic solvent (PGP) remained in the coating film, and the decomposed materials of tetrapropylammonium hydroxide or the like were vaporized and fallen out from the coating film, and then discharged to the outside together with the superheated steam introduced. Then, the substrates were cooled down to a temperature close to the room temperature and were taken out to the outside.

The following parameters of the silica-based coating films formed on the substrates 4A, 4B, and 4C obtained as described above were measured: (i) a specific dielectric constant, (ii) change in a moisture adsorption rate of the coating film immediately after irradiation of oxygen plasma, and (iii) a film strength, like in Example 1. Furthermore, the thicknesses of the coating films formed on the substrates 4A, 4B, and 4C obtained from the coating step (i.e., the coated films), and the thicknesses of the coating films formed on the substrates 4A, 4B, and 4C obtained from the heating step (i.e., the heated films) were measured, and then the shrinkage rates by volume of the coating films formed on the substrates by subjecting to the drying step and the heating step were calculated, like in Example 1. The measurement results are shown in Table 4.

As a result, it was found that the temperature for the drying step is required to be in the range from 25 to 340° C., preferably in the range from 100 to 250° C. It was further found that the film strength (as Young's modulus) of the coating films obtained is slightly lower than that of the coating films obtained in Example 1.

TABLE 4

|  |  | Example 4 |  |  |  |  |  |  |  |  | Comparative Example 4 |  |
|---|---|---|---|---|---|---|---|---|---|---|---|---|
| Drying Step | Temperature (° C.) | 25 | 60 | 90 | 120 | 150 | 170 | 190 | 250 | 300 | 350 | 400 |
|  | Gas atmosphere |  |  |  |  | Nitrogen gas |  |  |  |  |  |  |

TABLE 4-continued

| | | Example 4 | | | | | | | | | | Comparative Example 4 |
|---|---|---|---|---|---|---|---|---|---|---|---|---|
| | Supply rate (l/min) | 10 | | | | | | | | | | |
| | Processing time (min) | 3 | | | | | | | | | | |
| Heating Step | Temperature (° C.) | 250 | | | | | | | | | | |
| | Gas atmosphere | Superheated steam | | | | | | | | | | |
| | Supply rate (l/min) | 10 | | | | | | | | | | |
| | Processing time (min) | 30 | | | | | | | | | | |
| Substrate 4A | A | 2.6 | 2.6 | 2.6 | 2.6 | 2.6 | 2.6 | 2.6 | 2.6 | 2.6 | 2.6 | 2.6 |
| | B | None | None | None | None | None | None | None | None | None | None | None |
| | C | 9 | 9 | 10 | 11 | 12 | 12 | 11 | 10 | 9 | 7 | 7 |
| | D | 39 | 31 | 24 | 20 | 17 | 10 | 7 | 4 | 2 | 1 | 0.3 |
| Substrate 4B | A | 2 | 2 | 2 | 2 | 2 | 2 | 2 | 2 | 2 | 2 | 2 |
| | B | None | None | None | None | None | None | None | None | None | None | None |
| | C | 4 | 4 | 4 | 5 | 5 | 5 | 5 | 5 | 5 | 3 | 3 |
| | D | 25 | 20 | 17 | 11 | 9 | 6 | 5 | 3 | 2 | 1 | 0.2 |
| Substrate 4C | A | 2.4 | 2.4 | 2.4 | 2.4 | 2.4 | 2.4 | 2.4 | 2.4 | 2.4 | 2.4 | 2.4 |
| | B | None | None | None | None | None | None | None | None | None | None | None |
| | C | 7 | 7 | 7 | 8 | 8 | 8 | 8 | 7 | 7 | 5 | 5 |
| | D | 28 | 23 | 18 | 12 | 10 | 7 | 5 | 3 | 2 | 1 | 0.5 |

Note
A: Specific dielectric constant
B: Change in moisture adsorption rate
C: Young's modulus (GPa)
D: Shrinkage rate by volume (%)

Example 5 and Comparative Example 5

5 ml of each of the liquid compositions A, the liquid composition B, and the liquid composition C prepared in the Preparation of Liquid Composition A to C as described above was dripped by the well-known spin coating method (by using ACT-8 produced by Tokyo Electron Co. Ltd.) onto a 8-inch size silicon wafer substrate and coated on the substrate at the rotating speed of 2000 rpm for 20 seconds. The operation was repeated to obtain plural number of the substrate 5A, the substrate 5B, and the substrate 5C coated by the liquid composition A, the liquid composition B, and the liquid composition C respectively.

Then, the substrates were placed on a sheet-fed hot plate (ACT-8 produced by Tokyo Electron Co. Ltd.) set in a chamber of the heating device and the coating films formed on the substrates were dried for 3 minutes at a temperature of 150° C. with introduction of a nitrogen gas at the rate of about 10 l/min. In this step, the organic solvent (PGP) and water contained in the coating films were vaporized and fallen out from the film, and then discharged to the outside together with the nitrogen gas introduced.

The substrates were left as placed on the sheet-fed hot plate and the coating films (i.e., the dried films) formed on the substrates were heated for 30 minutes at a temperature as shown in Table 5 with introduction of a superheated steam having the temperature as shown in Table 5 obtained from a superheated steam generator (Super-Hi produced by Japan High Frequency Industry Co. Ltd.) at the rate of about 10 l/min. In this step, the water and organic solvent (PGP) remained in the coating film, and the decomposed materials of tetrapropylammonium hydroxide or the like were vaporized and fallen out from the coating film, and then discharged to the outside together with the superheated steam introduced. Then, the substrates were cooled down to a temperature close to the room temperature and were taken out to the outside.

The following parameters of the silica-based coating films formed on the substrates 5A, 5B, and 5C obtained as described above were measured: (i) a specific dielectric constant, (ii) change in a moisture adsorption rate of the coating film immediately after irradiation of oxygen plasma, and (iii) a film strength, like in Example 1. Furthermore, the thicknesses of the coating films formed on the substrates 5A, 5B, and 5C obtained from the coating step (i.e., the coated films), and the thicknesses of the coating films formed on the substrates 5A, 5B, and 5C obtained from the heating step (i.e., the heated films) were measured, and then the shrinkage rates by volume of the coating films formed on the substrates by subjecting to the drying step and the heating step were calculated, like in Example 1. The measurement results are shown in Table 5.

As a result, it was found that the temperature for the heating step is required to be in the range from 105 to 450° C., preferably in the range from 250 to 350° C. However, it was found that the film strength (as Young's modulus) of the coating film obtained is slightly lower than that of the coating films obtained in Example 1. Also it was found that, to obtain a coating film having a film strength almost equivalent or close to that of the coating film having been subjected to the curing step as described above, it is necessary to heat the coating film at a higher temperature than 250° C. (namely, from 250 to 450° C.) in the heating step.

TABLE 5

| | | Example 5 | CE5 |
|---|---|---|---|
| Drying Step | Temperature (° C.) | 150 | |
| | Gas atmosphere | Nitrogen gas | |
| | Supply rate | 10 | |

TABLE 5-continued

| | | Example 5 | | | | | | | | | | CE5 |
|---|---|---|---|---|---|---|---|---|---|---|---|---|
| | (l/min) | | | | | | | | | | | |
| | Processing time (min) | | | | | 3 | | | | | | |
| Heating Step | Temperature (° C.) | 105 | 120 | 150 | 190 | 210 | 250 | 300 | 350 | 400 | 450 | 500 |
| | Gas atmosphere | | | | | Superheated steam | | | | | | |
| | Supply rate (l/min) | | | | | 10 | | | | | | |
| | Processing time (min) | | | | | 30 | | | | | | |
| Substrate 5A | A | 2.7 | 2.7 | 2.7 | 2.6 | 2.6 | 2.6 | 2.5 | 2.6 | 2.6 | 2.7 | 2.8 |
| | B | None | None | None | None | None | None | None | None | None | None | None |
| | C | 10 | 10 | 10 | 10 | 10 | 12 | 12 | 11 | 11 | 11 | 12 |
| | D | 10 | 11 | 12 | 14 | 16 | 17 | 16 | 16 | 16 | 17 | 18 |
| Substrate 5B | A | 2.1 | 2.1 | 2.1 | 2 | 2 | 2 | 1.9 | 2 | 2 | 2.1 | 2.3 |
| | B | None | None | None | None | None | None | None | None | None | None | None |
| | C | 4 | 4 | 4 | 4 | 4 | 5 | 5 | 5 | 4 | 4 | 5 |
| | D | 6 | 6 | 7 | 8 | 9 | 9 | 9 | 9 | 9 | 10 | 11 |
| Substrate 5C | A | 2.5 | 2.5 | 2.5 | 2.4 | 2.4 | 2.4 | 2.3 | 2.4 | 2.4 | 2.5 | 2.6 |
| | B | None | None | None | None | None | None | None | None | None | None | None |
| | C | 7 | 7 | 7 | 7 | 7 | 8 | 8 | 8 | 8 | 9 | 10 |
| | D | 7 | 7 | 8 | 9 | 10 | 10 | 10 | 10 | 10 | 11 | 12 |

Note
CE5: Comparative Example 5
A: Specific dielectric constant
B: Change in moisture adsorption rate
C: Young's modulus (GPa)
D: Shrinkage rate by volume (%)

Example 6

5 ml of each of the liquid compositions A, the liquid composition B, and the liquid composition C prepared in the Preparation of Liquid Composition A to C as described above was dripped by the well-known spin coating method (by using ACT-8 produced by Tokyo Electron Co. Ltd.) onto a 8-inch size silicon wafer substrate and coated on the substrate at the rotating speed of 2000 rpm for 20 seconds. The operation was repeated to obtain plural number of the substrates 6A, the substrate 6B, and the substrate 6C coated by the liquid composition A, the liquid composition B, and the liquid composition C respectively.

The substrates were placed on the sheet-fed hot plate (ACT-8 produced by Tokyo Electron Co. Ltd.) set in a chamber of the heating device and the coating films (i.e., the dried films) formed on the substrates were heated for 30 minutes at a temperature as shown in Table 6 with introduction of a superheated steam having the temperature as shown in Table 6 obtained from a superheated steam generator (Super-Hi produced by Japan High Frequency Industry Co. Ltd.) at the rate of about 10 l/min. (The above method is hereinafter referred to as "one-stage heating method for the Example".) In this step, the water and organic solvent (PGP) contained in the coating film, and the decomposed materials of tetrapropylammonium hydroxide or the like were vaporized and fallen out from the coating film, and then discharged to the outside together with the superheated steam introduced. Then, the substrates were cooled down to a temperature close to the room temperature and were taken out to the outside.

On the other hand, the substrates obtained from the coating step as described above were placed on a sheet-fed hot plate (ACT-8 produced by Tokyo Electron Co. Ltd.) set in a chamber of the heating device, and the coating films formed on the substrates were heated for 3 minutes at a temperature as shown in Table 6 (i.e., 105° C. and 120° C.) with introduction of a superheated steam having the temperature as shown in Table 6 obtained from a superheated steam generator (Super-Hi produced by Japan High Frequency Industry Co. Ltd.) at the rate of about 10 l/min. In this step, the water and organic solvent (PGP) contained in the coating film, and the decomposed materials of tetrapropylammonium hydroxide or the like were vaporized and fallen out from the coating film, and then discharged to the outside together with the superheated steam introduced.

Then, the substrates were left as placed on the sheet-fed hot plate, and the coating films (i.e., the dried and heated films) formed on the substrates were heated for 30 minutes at a temperature of 250° C. with introduction of a superheated steam having the temperature of 250° C. obtained from a superheated steam generator (Super-Hi produced by Japan High Frequency Industry Co. Ltd.) at the rate of about 10 l/min. (The above method is hereinafter referred to as "two-stage heating method for the Example".) In this step, the water and organic solvent (PGP) remained in the coating film, and the decomposed materials of tetrapropylammonium hydroxide or the like were vaporized and fallen out from the coating film, and then discharged to the outside together with the superheated steam introduced. Then, the substrates were cooled down to a temperature close to the room temperature and were taken out to the outside.

The following parameters of the silica-based coating films formed on the substrates 6A, 6B, and 6C obtained as described above were measured: (i) a specific dielectric constant, (ii) change in a moisture adsorption rate of the coating film immediately after irradiation of oxygen plasma, and (iii) a film strength, like in Example 1. Furthermore, the thicknesses of the coating films formed on the substrates 6A, 6B, and 6C obtained from the coating step (i.e., the coated films), and the thicknesses of the coating films formed on the substrates 6A, 6B, and 6C obtained from the heating step (i.e., the heated films) were measured, and then the shrinkage rates by volume of the coating films formed on the substrates by subjecting to the heating step were calculated, like in Example 1. The measurement results are shown in Table 6.

As a result, it was found that the coating film subjected to the two-stage heating method for the Example has the physical properties close to those of the coating film obtained in Example 4. It was further found that the coating film subjected to the one-stage heating method for the Example has the physical properties close to or somewhat superior than those of the coating film obtained from the three-stages heating method for the Comparative Example as shown in Comparative Example 7.

the dried films) were heated for 30 minutes at a temperature of 250° C. with introduction of a saturated steam (having a temperature of about 100° C.) at the rate of about 10 l/min. In this step, the water and organic solvent (PGP) remained in the coating film, and the decomposed materials of tetrapropylammonium hydroxide or the like were vaporized and fallen out from the coating film, and then discharged to the outside together with the steam introduced. Then, the substrates were

TABLE 6

| | | Example 6 | | | | | | | | | | |
|---|---|---|---|---|---|---|---|---|---|---|---|---|
| Heating Step A | Temperature (° C.) | | | | — | | | | | | 105 | 120 |
| | Gas atmosphere | | | | — | | | | | | Superheated steam | |
| | Supply rate (l/min) | | | | — | | | | | | 10 | |
| | Processing time (min) | | | | — | | | | | | 3 | |
| Heating step B | Temperature (° C.) | 105 | 120 | 150 | 200 | 250 | 300 | 350 | 400 | 450 | 250 | |
| | Gas atmosphere | | | | | Superheated steam | | | | | | |
| | Supply rate (l/min) | | | | | 10 | | | | | | |
| | Processing time (min) | | | | | 30 | | | | | | |
| Substrate 6A | A | 2.7 | 2.7 | 2.7 | 2.6 | 2.6 | 2.5 | 2.5 | 2.5 | 2.6 | 2.5 | 2.5 |
| | B | None | None | None | None | None | None | None | None | None | None | None |
| | C | 10 | 10 | 10 | 10 | 12 | 12 | 11 | 11 | 11 | 11 | 11 |
| | D | 35 | 37 | 39 | 39 | 39 | 42 | 42 | 42 | 43 | 20 | 20 |
| Substrate 6B | A | 2.1 | 2.1 | 2.1 | 2 | 2 | 1.9 | 1.9 | 1.9 | 2 | 1.9 | 1.9 |
| | B | None | None | None | None | None | None | None | None | None | None | None |
| | C | 4 | 4 | 4 | 4 | 5 | 5 | 5 | 4 | 4 | 4 | 4 |
| | D | 21 | 23 | 25 | 25 | 25 | 28 | 28 | 28 | 29 | 11 | 11 |
| Substrate 6C | A | 2.5 | 2.5 | 2.5 | 2.4 | 2.4 | 2.3 | 2.3 | 2.3 | 2.4 | 2.3 | 2.3 |
| | B | None | None | None | None | None | None | None | None | None | None | None |
| | C | 7 | 7 | 7 | 7 | 8 | 8 | 8 | 8 | 9 | 7 | 7 |
| | D | 24 | 26 | 28 | 28 | 28 | 31 | 31 | 31 | 32 | 12 | 12 |

Note
A: Specific dielectric constant
B: Change in moisture adsorption rate
C: Young's modulus (GPa)
D: Shrinkage rate by volume (%)

Comparative Example 6

5 ml of each of the liquid compositions A, the liquid composition B, and the liquid composition C prepared in the Preparation of Liquid Composition A to C as described above was dripped by the well-known spin coating method (by using ACT-8 produced by Tokyo Electron Co. Ltd.) onto a 8-inch size silicon wafer substrate and coated on the substrate at the rotating speed of 2000 rpm for 20 seconds. The operation was repeated to obtain plural number of the substrate 7A, the substrate 7B, and the substrate 7C coated by the liquid composition A, the liquid composition B, and the liquid composition C respectively.

Then, the substrates were placed on a sheet-fed hot plate (ACT-8 produced by Tokyo Electron Co. Ltd.) set in a chamber of the heating device, and the coating films formed on the substrates (i.e., the coated films) were dried for 3 minutes at a temperature as shown in Table 7 with introduction of a nitrogen gas at the rate of about 10 l/min. In this step, the water and organic solvent (PGP) contained in the coating film were vaporized and fallen out from the coating film, and then discharged to the outside together with the nitrogen gas introduced.

For making a comparison to the coating films obtained in Example 4, the substrates were left as placed on the sheet-fed hot plate, and the coating films formed on the substrates (i.e., cooled down to a temperature close to the room temperature and were taken out to the outside.

The following parameters of the silica-based coating films formed on the substrates 7A, 7B, and 7C obtained as described above were measured: (i) a specific dielectric constant, (ii) change in a moisture adsorption rate of the coating film immediately after irradiation of oxygen plasma, and (iii) a film strength, like in Example 1. Furthermore, the thicknesses of the coating films formed on the substrates 7A, 7B, and 7C obtained from the coating step (i.e., the coated films), and the thicknesses of the coating films formed on the substrates 7A, 7B, and 7C obtained from the heating step with introduction of the steam (i.e., the heated films) were measured, and then the shrinkage rates by volume of the coating films formed on the substrates by subjecting to the heating step were calculated, like in Example 1. The measurement results are shown in Table 7.

As a result, it was found that the coating film obtained in Comparative Example 6 has a higher specific dielectric constant and a lower film strength as compared to the coating film obtained in Example 4. When the coating film dried at a relatively low temperature (for instance, at 200° C. or below) was heated with the steam, it was observed that the specific dielectric constant becomes relatively higher. When the coating film dried at a relatively higher temperature (for instance, at 250° C. or more) was heated with the steam, it was observed that the film strength (as Young's modulus) becomes lower. And also, some change was observed between the moisture adsorption rates before irradiation of oxygen plasma and that immediately after irradiation of oxygen plasma. Namely the moisture adsorption rate of the coating film prepared by this method increased after irradiation of oxygen plasma. Therefore, it was found that it is difficult to stably obtain coating films, which would be put into a practical use, only by drying and heating the coating films with introduction of the steam.

Then, the substrates were cooled down to a temperature close to the room temperature and were taken out to the outside.

For making a comparison to the coating films obtained in Example 1, the substrates 8A, 8B, and 8C having been subjected to the coating step were placed on a sheet-fed hot plate (ACT-8 produced by Tokyo Electron Co. Ltd.) set in a chamber of the heating device, and the coating films (i.e., the coated films) formed on the substrates were dried for 3 minutes at a temperature as shown in Table 8 with introduction of

TABLE 7

| | | Comparative Example 6 | | | | | | | | | | |
|---|---|---|---|---|---|---|---|---|---|---|---|---|
| Drying Step | Temperature (° C.) | 25 | 60 | 90 | 120 | 150 | 170 | 190 | 250 | 300 | 350 | 400 |
| | Gas atmosphere | | | | | | Nitrogen gas | | | | | |
| | Supply rate (l/min) | | | | | | 10 | | | | | |
| | Processing time (min) | | | | | | 3 | | | | | |
| Heating Step | Temperature (° C.) | | | | | | 250 | | | | | |
| | Gas atmosphere | | | | | | Steam | | | | | |
| | Supply rate (l/min) | | | | | | 10 | | | | | |
| | Processing time (min) | | | | | | 30 | | | | | |
| Substrate 7A | A | 3.0 | 2.9 | 2.9 | 2.8 | 2.8 | 2.8 | 2.8 | 2.7 | 2.7 | 2.7 | 2.7 |
| | B | Ob'd | Ob'd | Ob'd | Ob'd | Ob'd | Ob'd | Ob'd | Ob'd | Ob'd | Ob'd | Ob'd |
| | C | 9 | 9 | 10 | 11 | 12 | 12 | 11 | 10 | 9 | 8 | 8 |
| | D | 39 | 31 | 24 | 20 | 17 | 10 | 7 | 4 | 2 | 1 | 0.3 |
| Substrate 7B | A | 2.3 | 2.3 | 2.3 | 2.2 | 2.2 | 2.2 | 2.2 | 2.1 | 2.1 | 2.1 | 2.1 |
| | B | Ob'd | Ob'd | Ob'd | Ob'd | Ob'd | Ob'd | Ob'd | Ob'd | Ob'd | Ob'd | Ob'd |
| | C | 4 | 4 | 4 | 5 | 5 | 5 | 5 | 5 | 5 | 4 | 4 |
| | D | 25 | 20 | 17 | 11 | 9 | 6 | 5 | 3 | 2 | 1 | 0.2 |
| Substrate 7C | A | 2.7 | 2.7 | 2.7 | 2.6 | 2.6 | 2.6 | 2.6 | 2.6 | 2.5 | 2.5 | 2.5 |
| | B | Ob'd | Ob'd | Ob'd | Ob'd | Ob'd | Ob'd | Ob'd | Ob'd | Ob'd | Ob'd | Ob'd |
| | C | 7 | 7 | 7 | 8 | 8 | 8 | 8 | 7 | 7 | 6 | 6 |
| | D | 28 | 23 | 18 | 12 | 10 | 7 | 5 | 3 | 2 | 1 | 0.5 |

Note
Ob'd: Observed
A: Specific dielectric constant
B: Change in moisture adsorption rate
C: Young's modulus (GPa)
D: Shrinkage rate by volume (%)

Comparative Example 7

5 ml of each of the liquid compositions A, the liquid composition B, and the liquid composition C prepared in the Preparation of Liquid Composition A to C as described above was dripped by the well-known spin coating method (by using ACT-8 produced by Tokyo Electron Co. Ltd.) onto a 8-inch size silicon wafer substrate and coated on the substrate at the rotating speed of 2000 rpm for 20 seconds. The operation was repeated to obtain plural number of the substrates 8A, the substrate 8B, and the substrate 8C coated by the liquid composition A, the liquid composition B, and the liquid composition C respectively.

Then, the substrates were placed on a sheet-fed hot plate (ACT-8 produced by Tokyo Electron Co. Ltd.) set in a chamber of the heating device, and the coating films formed on the substrates (i.e., the coated films) were dried for 3 minutes at a temperature of 150° C. with introduction of a nitrogen gas at the rate of about 10 l/min. In this step, the water and organic solvent (PGP) contained in the coating film were vaporized and fallen out from the coating film, and then discharged to the outside together with the nitrogen gas introduced.

Then, the substrates were left as placed on the sheet-fed hot plate, and the coating films formed on the substrates (i.e., the dried films) were cured for 30 minutes at a temperature of 400° C. with introduction of a nitrogen gas at the rate of about 10 l/min. (The above method is hereinafter referred to as "two-stages heating method for the Comparative Example").

a nitrogen gas at the rate of about 10 l/min. In this step, the water and organic solvent (PGP) contained in the coating film were vaporized and fallen out from the coating film, and then discharged to the outside together with the nitrogen gas introduced.

Then, the substrates were left as placed on the sheet-fed hot plate, and the coating films (i.e., the dried films) formed on the substrates were heated for 30 minutes at a temperature of 250° C. with introduction of a nitrogen gas or air at the rate of about 10 l/min. In this step, the water and organic solvent (PGP) remained in the coating film, and the decomposed materials of tetrapropylammonium hydroxide or the like were vaporized and fallen out from the coating film, and then discharged to the outside together with the nitrogen gas or air introduced.

Furthermore, the substrates were left as placed on the sheet-fed hot plate and the coating films (i.e., the heated films) formed on the substrates were cured for 30 minutes at a temperature of 400° C. with introduction of a nitrogen gas at the rate of about 10 l/min. (The above method is hereinafter referred to as "three-stages heating method for the Comparative Example.) Then, the substrates were cooled down to a temperature close to the room temperature and were taken out to the outside.

The following parameters of the silica-based coating films formed on the substrates 8A, 8B, and 8C obtained as described above were measured: (i) a specific dielectric constant, (ii) change in a moisture adsorption rate of the coating film immediately after irradiation of oxygen plasma, and (iii) a film strength, like in Example 1. Furthermore, the thicknesses of the coating films formed on the substrates 8A, 8B, and 8C obtained from the coating step (i.e., the coated films), and the thicknesses of the coating films formed on the substrates 8A, 8B, and 8C obtained from the curing step (i.e., the cured films) were measured, and then the shrinkage rates by volume of the coating films formed on the substrates by subjecting to the curing step were calculated, like in Example 1. The measurement results are shown in Table 8.

Of these measurement results, the shrinkage rates by volume of the coating films formed on each of the substrate 8A with use of the three-stages heating method for the Comparative Example are shown as a graph in FIG. 5 respectively.

As a result, it was found that the coating films on the substrate obtained by both the two-stages heating method for the Comparative Example and the three-stages heating method for the Comparative Example have a lower film strength (as Young's modulus), as compared to the coating films formed on the substrates in Example 1. It was further found that the shrinkage rates of the coating films as described above are substantially low.

the substrate 1A prepared in Example 1, in which the horizontal axis represents a temperature employed in the drying step and the vertical axis represents a shrinkage rate;

FIG. 4 is a graph showing a result of the specific dielectric constant measured for the coating film formed on each of the substrate 2A prepared in Example 2, in which the horizontal axis represents a temperature for the heating step (i.e., a temperature of a superheated steam), and the vertical axis represents a specific dielectric constant;

FIG. 5 is a graph showing a result of the shrinkage rate by volume (%) measured for the coating film formed on each of the substrate 8A prepared by the three-stages heating method for the Comparative Example as shown in Example 7, in which the horizontal axis represents a temperature employed in the drying step and the vertical axis represents a shrinkage rate. FIG. 5 also shows a result of the shrinkage rate by volume (%) measured for the coating film formed on each of the substrate 1A prepared in Example 1 as shown in FIG. 3, to make the comparison easily.

TABLE 8

Comparative Example 7

| | | | | | | | | | | | | | |
|---|---|---|---|---|---|---|---|---|---|---|---|---|---|
| Drying Step | Temperature (° C.) | 25 | 50 | 250 | 350 | 400 | 25 | 150 | 250 | 350 | 400 | 150 |
| | Gas atmosphere | Nitrogen gas | | | | | | | | | | |
| | Supply rate (l/min) | 10 | | | | | | | | | | |
| | Processing time (min) | 3 | | | | | | | | | | |
| Heating Step | Temperature (° C.) | | | 250 | | | | | 250 | | | — |
| | Gas atmosphere | | | Nitrogen gas | | | | | Air | | | — |
| | Supply rate (l/min) | | | 10 | | | | | 10 | | | — |
| | Processing time (min) | | | 30 | | | | | 30 | | | — |
| Curing Step | Temperature (° C.) | 400 | | | | | | | | | | |
| | Gas atmosphere | Nitrogen gas | | | | | | | | | | |
| | Supply rate (l/min) | 10 | | | | | | | | | | |
| | Processing time (min) | 30 | | | | | | | | | | |
| Substrate 8A | A | 2.4 | 2.5 | 2.5 | 2.5 | 2.5 | 2.5 | 2.6 | 2.6 | 2.6 | 2.6 | 2.4 |
| | B | None | None | None | None | None | None | None | None | None | None | None |
| | C | 6 | 9 | 8 | 8 | 8 | 7 | 9 | 8 | 8 | 8 | 6 |
| | D | 29 | 7 | 2 | 1 | 0.4 | 31 | 9 | 3 | 1 | 0.5 | 5 |
| Substrate 8B | A | 1.8 | 1.9 | 1.9 | 1.9 | 1.9 | 1.9 | 2.0 | 2.0 | 2.0 | 2.0 | 1.8 |
| | B | None | None | None | None | None | None | None | None | None | None | None |
| | C | 2 | 4 | 4 | 4 | 4 | 3 | 4 | 4 | 4 | 4 | 3 |
| | D | 22 | 5 | 2 | 1 | 0.3 | 23 | 5 | 2 | 1 | 0.5 | 3 |
| Substrate 8C | A | 2.2 | 2.3 | 2.3 | 2.3 | 2.3 | 2.3 | 2.4 | 2.4 | 2.4 | 2.4 | 2.2 |
| | B | None | None | None | None | None | None | None | None | None | None | None |
| | C | 5 | 7 | 6 | 6 | 6 | 6 | 7 | 6 | 6 | 6 | 5 |
| | D | 24 | 7 | 2 | 1 | 0.3 | 25 | 6 | 2 | 1 | 0.3 | 5 |

Note
A: Specific dielectric constant
B: Change in moisture adsorption rate
C: Young's modulus (GPa)
D: Shrinkage rate by volume (%)

BRIEF DESCRIPTION OF THE DRAWINGS

FIG. 3 is a graph showing a result of the shrinkage rate by volume (%) measured for the coating film formed on each of

Figure 1:
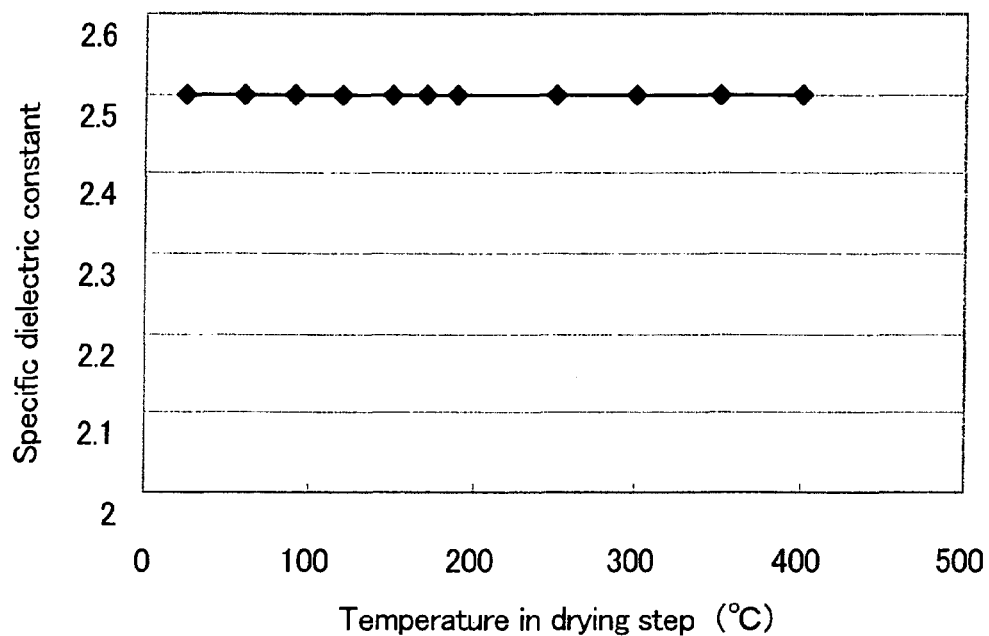
FIG. 1 is a graph showing a result of the specific dielectric constant measured for the coating film formed on each of the substrate 1A prepared in Example 1, in which the horizontal axis represents a temperature employed in the drying step and the vertical axis represents a specific dielectric constant.
Figure 2:
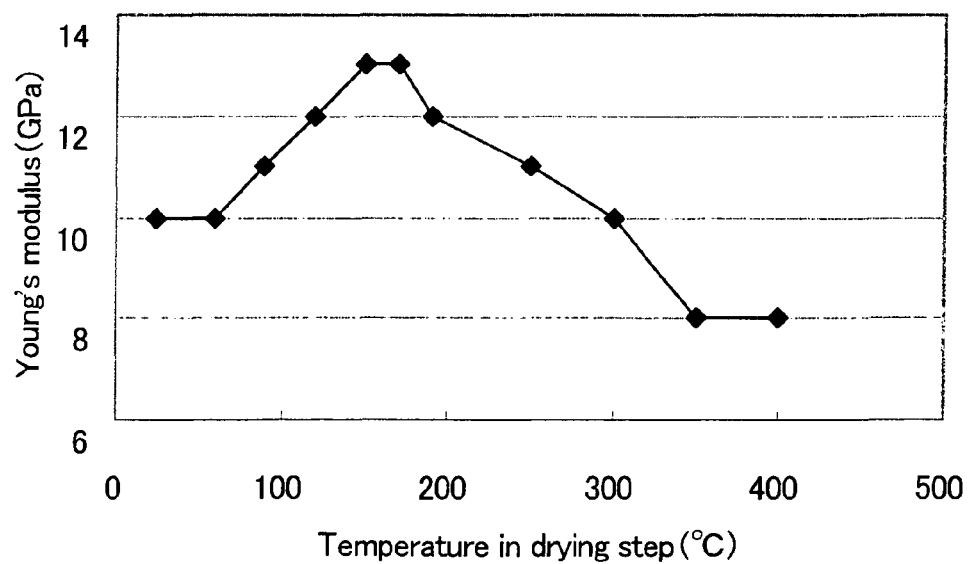
FIG. 2 is a graph showing a result of the Young's modulus (GPa) measured for the coating film formed on each of the substrate 1A prepared in Example 1, in which the horizontal axis represents a temperature employed in the drying step and the vertical axis represents a Young's modulus.
Figure 3:
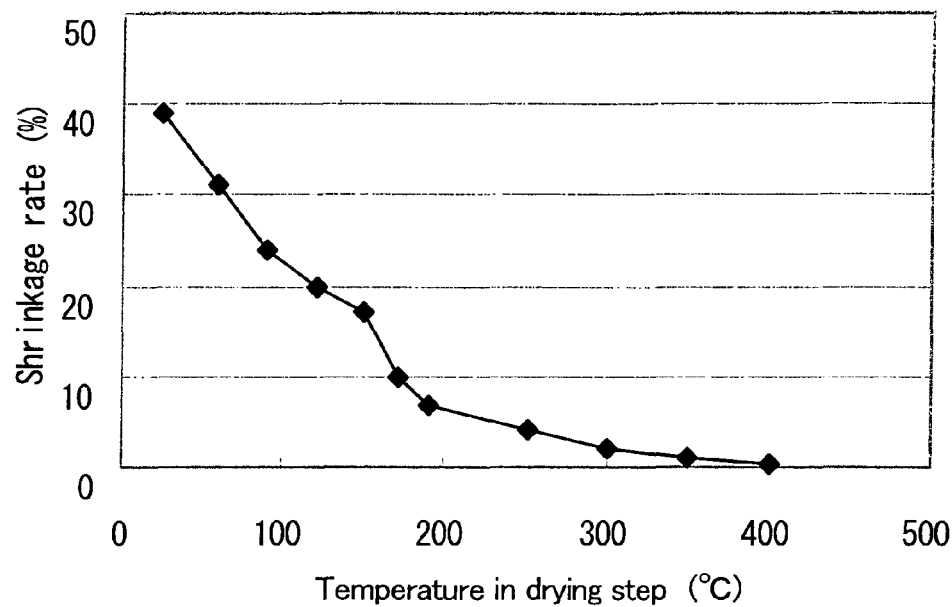
Figure 4:
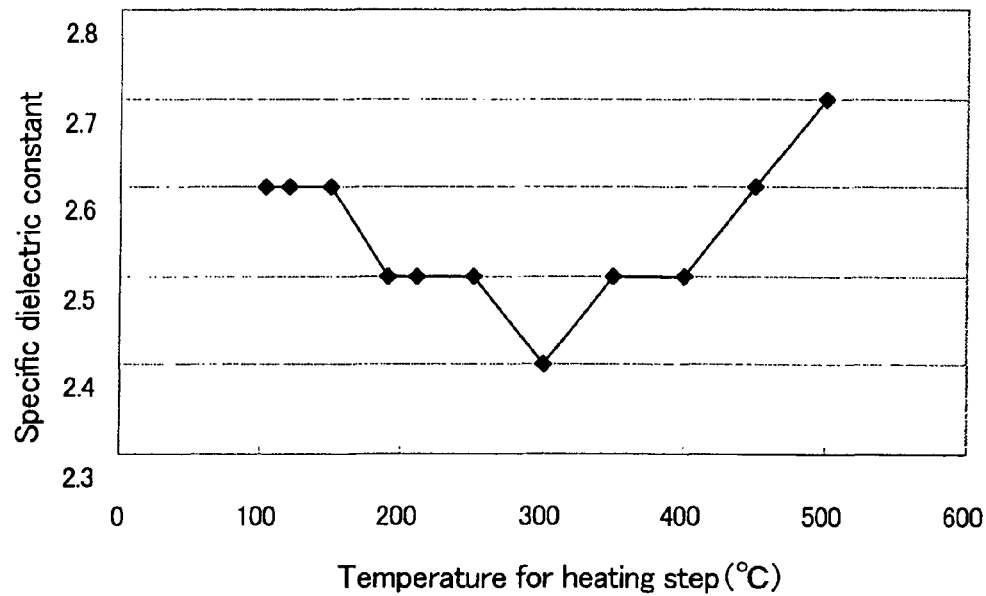
Figure 5:
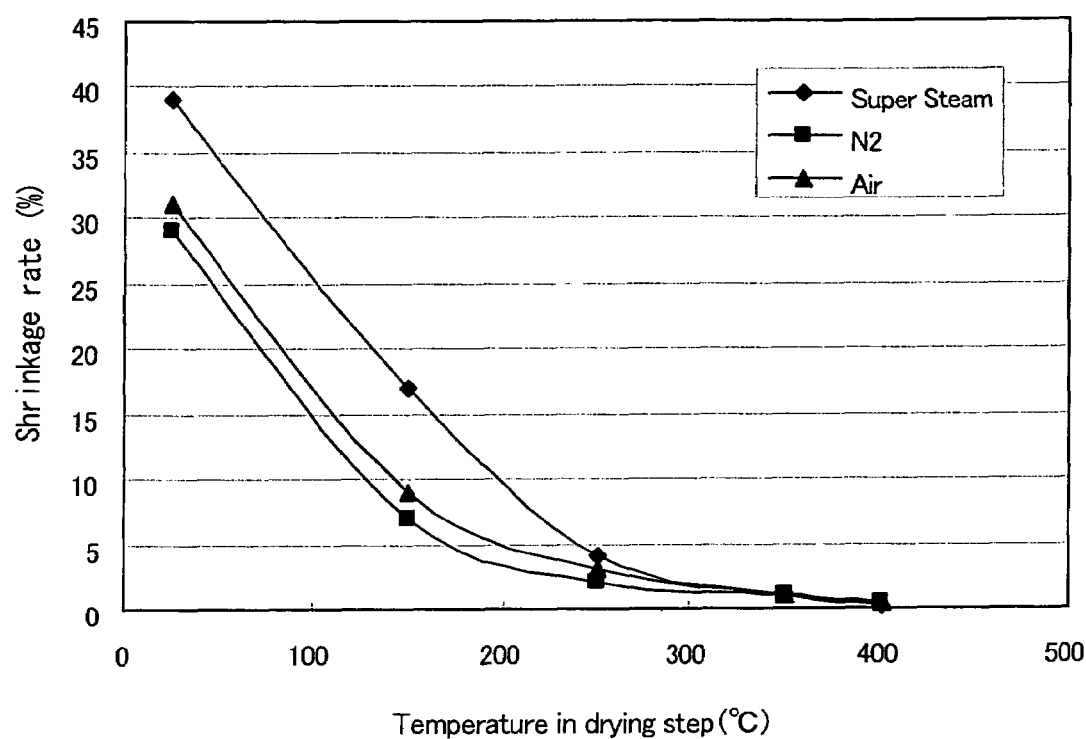

The invention claimed is:

1. A method of forming on a substrate an amorphous silica-based coating film with a low dielectric constant of 3.0 or below and a high film strength, as expressed by Young's modulus, of 3.0 GPa or more, which comprises the steps of:
   (1) coating on the substrate a liquid composition comprising hydrolysate of an organic silicon compound or compounds hydrolyzed in the presence of tetraalkylammonium hydroxide (TAAOH) (i.e., coating step);
   (2) setting the substrate in a chamber, and then drying a coating film formed on the substrate at a temperature in the range from 25 to 340° C. (i.e., drying step);
   (3) heating the coating film at a temperature in the range from 105 to 450° C. with introduction of a superheated steam having such a temperature into the chamber (i.e., heating step); and (4) curing the coating film at a temperature in the range from 350 to 450° C. with introduction of a nitrogen gas into the chamber (i.e., curing step).

2. The method of forming an amorphous silica-based coating film with a low dielectric constant according to claim 1, wherein the liquid composition used in the coating step contains hydrolysate of organic silicon compounds obtained by hydrolyzing, in the presence of tetraalkylammonium hydroxide (TAAOH), tetraalkyl orthosilicate (TAOS) and alkoxysilane (AS) expressed by the following general formula (I):

$$X_nSi(OR)_{4-n} \qquad (I)$$

(wherein X denotes a hydrogen atom, a fluorine atom, an alkyl group having 1 to 8 carbon atoms, a fluoride-substituted alkyl group, an aryl group, or a vinyl group; and R denotes a hydrogen atom, an alkyl group having 1 to 8 carbon atoms, an aryl group, or a vinyl group; and n is an integer of 1 to 3).

3. The method of forming an amorphous silica-based coating film with a low dielectric constant according to claim 1, wherein the liquid composition used in the coating step contains hydrolysate of organic silicon compounds obtained by hydrolyzing, in the presence of tetraalkylammonium hydroxide (TAAOH), bis(trialkoxysilyl)alkane (BTASA) expressed by the following general formula (II) and alkoxysilane (AS) expressed by the following general formula (I):

$$X_nSi(OR)_{4-n} \qquad (I)$$

(wherein X denotes a hydrogen atom, a fluorine atom, an alkyl group having 1 to 8 carbon atoms, a fluoride-substituted alkyl group, an aryl group, or a vinyl group; and R denotes a hydrogen atom, an alkyl group having 1 to 8 carbon atoms, an aryl group, or a vinyl group; and n is an integer of 1 to 3), and

(wherein $R^1$ denotes a methylene group, an ethylene group, or a propylene group; and $R^2$ to $R^7$, which may be identical to or different from each other, denotes a hydrogen atom, an alkyl group having 1 to 8 carbon atoms, a fluorine-substituted alkyl group, an aryl group, or a vinyl group).

4. The method of forming an amorphous silica-based coating film with a low dielectric constant according to claim 1, wherein the liquid composition used in the coating step contains hydrolysate of organic silicon compounds obtained by hydrolyzing, in the presence of tetraalkylammonium hydroxide (TAAOH), bis(trialkoxysilyl)alkane (BTASA) expressed by the following general formula (II), alkoxysilane (AS) expressed by the following general formula (I), and tetraalkyl orthosilicate (TAOS):

$$X_nSi(OR)_{4-n} \qquad (I)$$

(wherein X denotes a hydrogen atom, a fluorine atom, an alkyl group having 1 to 8 carbon atoms, a fluoride-substituted alkyl group, an aryl group, or a vinyl group; and R denotes a hydrogen atom, an alkyl group having 1 to 8 carbon atoms, an aryl group, or a vinyl group; and n is an integer of 1 to 3), and

(wherein $R^1$ denotes a methylene group, an ethylene group, or a propylene group; and $R^2$ to $R^7$, which may be identical to or different from each other, denotes a hydrogen atom, an alkyl group, a fluorine-substituted alkyl group having 1 to 8 carbon atoms, an aryl group or a vinyl group).

5. The method of forming an amorphous silica-based coating film with a low dielectric constant according to claim 1, wherein the operation in the coating step is carried out with use of a spin coating method.

6. The method of forming an amorphous silica-based coating film with a low dielectric constant according to claim 1, wherein the operation in the drying step is carried out for 0.5 to 10 minutes at a temperature in the range from 25 to 340° C. with introduction of a nitrogen gas or air into the chamber.

7. The method of forming an amorphous silica-based coating film with a low dielectric constant according to claim 6, wherein the drying temperature is in the range from 100 to 250° C.

8. The method of forming an amorphous silica-based coating film with a low dielectric constant according to claim 1, wherein the operation in the heating step is carried out for 1 to 70 minutes at a temperature in the range from 105 to 450° C. with introduction of a superheated steam having such a temperature into the chamber.

9. The method of forming an amorphous silica-based coating film with a low dielectric constant according to claim 8, wherein the heating temperature is in the range from 250 to 350° C.

10. The method of forming an amorphous silica-based coating film with a low dielectric constant according to claim 1, wherein the operation in the curing step is carried out for 5 to 90 minutes at a temperature in the range from 350 to 450° C. with introduction of a nitrogen gas into the chamber.

11. The method of forming an amorphous silica-based coating film with a low dielectric constant according to claim 1, wherein the operations up to the heating step or the curing step are carried out in such conditions that the coating film obtained from the heating step or the curing step has a volume with a shrinkage of 5 to 40% as against the volume of the coating film formed in the coating step.

12. A method of forming on a substrate an amorphous silica-based coating film with a low dielectric constant of 3.0 or below and a high film strength, as expressed by Young's modulus, of 3.0 GPa or more, which comprises the steps of:
   (1) coating on the substrate a liquid composition comprising hydrolysate of an organic silicon compound or compounds hydrolyzed in the presence of tetraalkylammonium hydroxide (TAAOH) (i.e., coating step);
   (2) setting the substrate in a chamber, and then drying a coating film formed on the substrate at a temperature in the range from 25 to 340° C. (i.e., drying step); and
   (3) heating the coating film at a temperature in the range from 105 to 450° C. with introduction of a superheated steam having such a temperature into the chamber (i.e., heating step).

13. A method of forming on a substrate an amorphous silica-based coating film with a low dielectric constant of 3.0 or below and a high film strength, as expressed by Young's modulus, of 3.0 GPa or more, which comprises the steps of:
   (1) coating on the substrate a liquid composition comprising hydrolysate of an organic silicon compound or compounds hydrolyzed in the presence of tetraalkylammonium hydroxide (TAAOH) (i.e., coating step); and
   (2) setting the substrate in a chamber, and then heating a coating film formed on the substrate at a temperature or temperatures in the range from 105 to 450° C. with introduction of a superheated steam having such a temperature into the chamber (i.e., heating step).

14. The method of forming an amorphous silica-based coating film with a low dielectric constant according to claim 13, wherein the operation in the heating step is carried out for 1 to 20 minutes at a temperature in the range from 105 to 130° C. with introduction of a superheated steam having such a temperature into the chamber and then for 1 to 70 minutes at a temperature in the range from 130 to 450° C. with introduction of a superheated steam having such a temperature into the chamber.

15. An amorphous silica-based coating film with a low dielectric constant, wherein the coating film obtained by the method according to claim 1 has a specific dielectric constant of 3.0 or below and a film strength, as expressed by Young's modulus, of 3.0 GPa or more.

16. The amorphous silica-based coating film with a low dielectric constant according to claim 15, wherein the coating film is an inter-layer insulating film formed on a semiconductor substrate.

* * * * *